(12) United States Patent
Gogoi et al.

(10) Patent No.: US 7,999,250 B2
(45) Date of Patent: Aug. 16, 2011

(54) SILICON-GERMANIUM-CARBON SEMICONDUCTOR STRUCTURE

(75) Inventors: Bishnu Prasanna Gogoi, Scottsdale, AZ (US); Robert Bruce Davies, Tempe, AZ (US)

(73) Assignee: HVVi Semiconductors, Inc., Phoenix, AZ (US)

( * ) Notice: Subject to any disclaimer, the term of this patent is extended or adjusted under 35 U.S.C. 154(b) by 352 days.

(21) Appl. No.: 12/394,285

(22) Filed: Feb. 27, 2009

(65) Prior Publication Data
US 2009/0224339 A1    Sep. 10, 2009

Related U.S. Application Data

(60) Provisional application No. 61/033,526, filed on Mar. 4, 2008.

(51) Int. Cl.
| | |
|---|---|
| H01L 29/06 | (2006.01) |
| H01L 31/0328 | (2006.01) |
| H01L 31/0336 | (2006.01) |
| H01L 31/072 | (2006.01) |
| H01L 31/109 | (2006.01) |
| H01L 29/10 | (2006.01) |
| H01L 29/04 | (2006.01) |
| H01L 31/036 | (2006.01) |
| H01L 31/0376 | (2006.01) |
| H01L 31/20 | (2006.01) |
| H01L 29/12 | (2006.01) |

(52) U.S. Cl. ............... 257/19; 257/55; 257/63; 257/65; 257/E21.092; 257/E21.102; 257/E21.115; 257/E21.145; 257/E21.162; 257/E31.042; 257/E31.044; 257/E31.048; 257/E31.049; 257/E31.06

(58) Field of Classification Search .................... 257/19, 257/55, 63, 65, E21.092, E21.102, E21.115, 257/E21.145, E21.162, E31.042, E31.044, 257/E31.048, E31.049, E31.06
See application file for complete search history.

(56) References Cited

U.S. PATENT DOCUMENTS

| 6,190,975 B1 * | 2/2001 | Kubo et al. .................... 438/285 |
| 6,472,685 B2 | 10/2002 | Takagi | |
| 6,893,934 B2 * | 5/2005 | Ohnishi et al. ................ 438/369 |

(Continued)

FOREIGN PATENT DOCUMENTS

WO    2009/111305 A2    9/2009

(Continued)

OTHER PUBLICATIONS

International Preliminary Report on Patentability and Written Opinion received for PCT Patent Application No. PCT/US2009/035461, mailed on Sep. 16, 2010, 6 Pages.

(Continued)

*Primary Examiner* — Ida M Soward
(74) *Attorney, Agent, or Firm* — Cool Patent, P.C.; Kenneth J. Cool

(57) ABSTRACT

In accordance with one or more embodiments, a semiconductor structure includes a semiconductor substrate, a first semiconductor material over the semiconductor substrate, and a second semiconductor material over a portion the first semiconductor material, wherein the second semiconductor material comprises silicon-germanium-carbon (SiGeC) and wherein the first semiconductor material is a silicon epitaxial layer. The semiconductor structure further includes an active device, wherein a portion of the active device is formed in the second semiconductor material and a dielectric structure extending from the first surface of the first semiconductor material into the semiconductor substrate through the first semiconductor material.

18 Claims, 23 Drawing Sheets

U.S. PATENT DOCUMENTS

| | | |
|---|---|---|
| 7,091,099 B2 | 8/2006 | Ohnishi et al. |
| 7,109,095 B2 * | 9/2006 | Notake et al. ............... 438/478 |
| 7,176,524 B2 * | 2/2007 | Loechelt et al. ............. 257/341 |
| 7,691,734 B2 * | 4/2010 | Orner et al. .................. 438/510 |
| 7,705,426 B2 * | 4/2010 | Voldman ...................... 257/592 |
| 7,741,665 B2 * | 6/2010 | Kang et al. ................... 257/292 |
| 7,842,973 B2 * | 11/2010 | Miura et al. ................. 257/197 |
| 2004/0014271 A1 * | 1/2004 | Cantell et al. ................ 438/205 |
| 2004/0195655 A1 | 10/2004 | Ohnishi et al. |
| 2007/0275533 A1 * | 11/2007 | Vaed et al. ................... 438/329 |
| 2007/0293013 A1 * | 12/2007 | John et al. .................... 438/372 |
| 2008/0092094 A1 * | 4/2008 | Coolbaugh et al. ............... 716/4 |
| 2009/0176347 A1 * | 7/2009 | Cheng et al. ................. 438/388 |

FOREIGN PATENT DOCUMENTS

WO    2009/111305 A3    12/2009

OTHER PUBLICATIONS

PCT/US2009/035461, "International Search Report & Written Opinion Received for PCT Patent Application No. PCT/US2009/035461, mailed on Oct. 15, 2009.", 11 pages.

* cited by examiner

US 7,999,250 B2

SILICON-GERMANIUM-CARBON SEMICONDUCTOR STRUCTURE

CROSS-REFERENCE TO RELATED APPLICATIONS

The present application claims the benefit of U.S. Provisional Application No. 61/033,526 filed Mar. 4, 2008. Said Application No. 61/033,526 is hereby incorporated herein by reference in its entirety.

TECHNICAL FIELD

Embodiments disclosed in the present disclosure relate generally to electrical and semiconductor technology, and more specifically to a semiconductor structures that includes an active device.

BACKGROUND

For some applications, it is desirable to have silicon based transistors that have relatively high output power. In addition, it is desirable to have silicon based transistors that have relatively high operating frequencies. Semiconductor designers have to balance cost and complexity to achieve high power and/or high frequency transistors.

Figure 1:
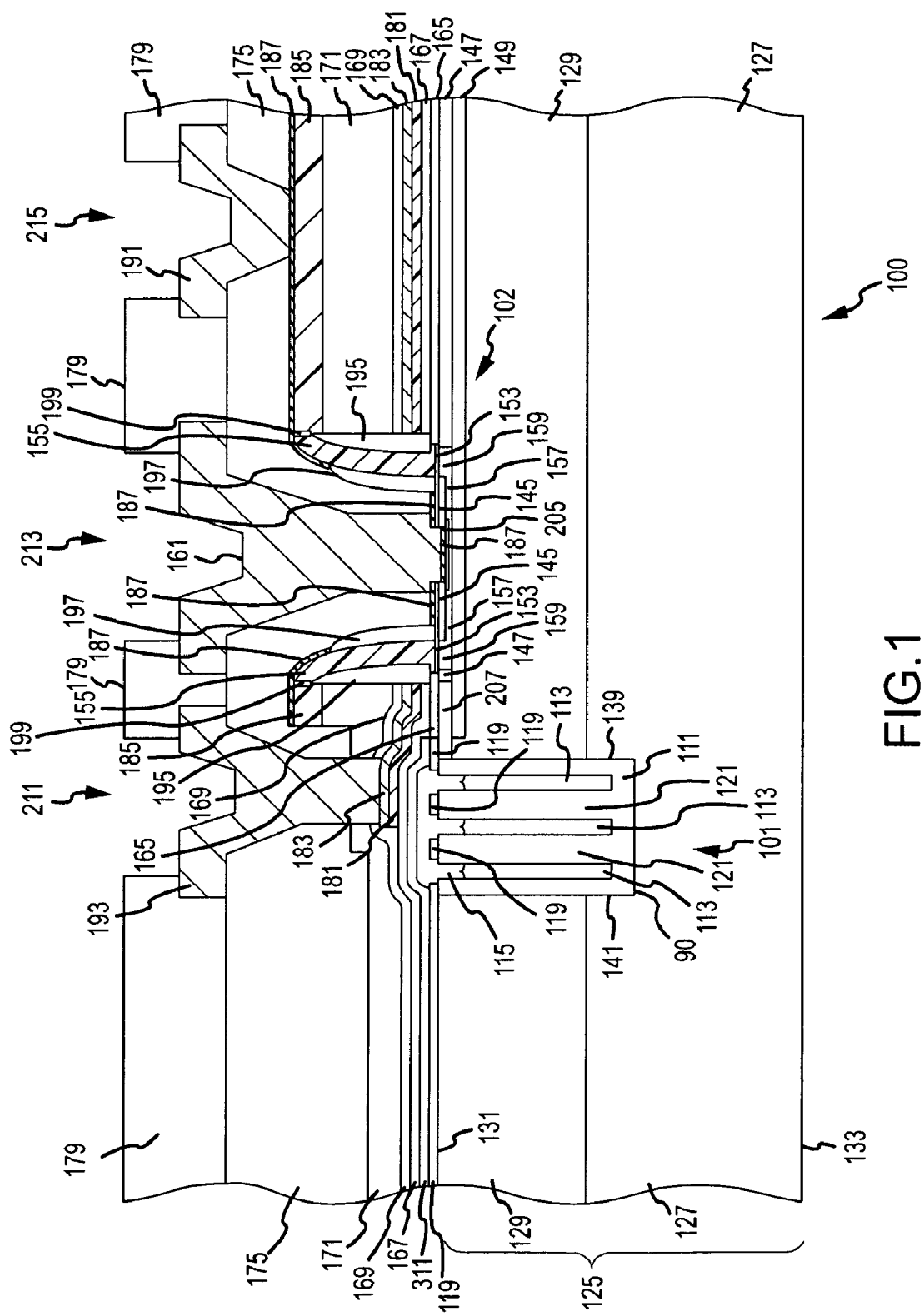
FIG. 1 is a cross-sectional view of a semiconductor structure in accordance with an embodiment.

For simplicity of illustration and ease of understanding, elements in the various figures are not necessarily drawn to scale, unless explicitly so stated. Further, if considered appropriate, reference characters have been repeated among the figures to indicate corresponding and/or analogous elements.

DETAILED DESCRIPTION

In some instances, well-known methods, procedures, components and circuits have not been described in detail so as not to obscure the present disclosure. The following detailed description is merely exemplary in nature and is not intended to limit the disclosure of this document and uses of the disclosed embodiments. Furthermore, there is no intention that the appended claims be limited by the title, technical field, background, or abstract.

In the following description and claims, the terms "comprise" and "include," along with their derivatives, may be used and are intended as synonyms for each other. In addition, in the following description and claims, the terms "coupled" and "connected," along with their derivatives, may be used. "Connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other. For example, "coupled" may mean that two or more elements do not contact each other but are indirectly joined together via another element or intermediate elements. Finally, the terms "on," "overlying," and "over" may be used in the following description and claims. "On," "overlying," and "over" may be used to indicate that two or more elements are in direct physical contact with each other. However, "over" may also mean that two or more elements are not in direct contact with each other. For example, "over" may mean that one element is above another element but not be in contact with each other and may have another element or elements in between the two elements.

Transistors and diodes may be referred to generally as active elements or active devices and resistors, inductors, capacitors, and electrical interconnects may be referred to generally as passive elements or passive devices. As is generally understood, a bipolar transistor includes a collector region, a base region, and an emitter region and a field effect transistor (FET) includes a gate, a drain region, a source region, and a channel region. The drain region, the source region, the channel region, or the gate of a FET may each be referred to as a portion, a part, a component, or an element of the FET, and similarly, the collector region, the base region, and the emitter region of a bipolar transistor may each be referred to as a portion, a part, a component, or an element of the bipolar transistor.

Generally, transistors such as bipolar transistors and field effect transistors (FETs) discussed herein are understood to provide a conduction path between first and second conduction electrodes when a control signal is applied to a control electrode. For example, in a FET a channel region formed between the drain and source regions provides the conduction path which is controlled in accordance with the magnitude of the control signal. The gate electrode of a FET may be referred to as a control electrode and the drain and source electrodes of a FET may be referred to as current carrying electrodes or conduction electrodes. Likewise, the base of a bipolar transistor may be referred to as the control electrode and the collector and emitter electrodes of the bipolar transistor may be referred to as conduction electrodes or current carrying electrodes. In addition, the drain and source electrodes of a FET may be referred to as power electrodes and the collector and emitter electrodes of a bipolar transistor may also be referred to as power electrodes.

FIG. 1 is a cross-sectional view of a semiconductor structure 100 that illustrates an isolation structure 101 and an active device 102 formed in and above a semiconductor material 125. Semiconductor material 125 may comprise one or more semiconductor materials. In some embodiments, semiconductor material 125 may comprise a semiconductor substrate 127 and a semiconductor layer 129. Semiconductor layers 127 and 129 may also be referred to as semiconductor materials or semiconductor base layers.

In some embodiments, substrate 127 comprises silicon doped with an impurity material of n-type conductivity such as, for example, phosphorous or arsenic. In one or more embodiments, the resistivity of substrate 127 ranges from about 0.001 ohm-centimeters ($\Omega$-cm) to about 0.003 $\Omega$-cm, although the methods and apparatuses described herein are not limited in this regard. The conductivity type of substrate 127 is not limited to being n-type conductivity, as substrate 127 can be p-type conductivity in other embodiments. An impurity material is also referred to as a dopant or impurity species. Semiconductor layer 129 has a top surface 131 and may be an n-type epitaxial layer and the resistivity of epitaxial layer 129 may range from about one $\Omega$-cm to about two $\Omega$-cm. In some embodiments, epitaxial layer 129 may comprise silicon, and epitaxial layer 129 is devoid, or substantially devoid, of germanium and is devoid, or substantially devoid, of carbon. Substrate 127 has an opposing boundary or bottom surface 133 that is parallel to, or substantially parallel to, top surface 131.

In some embodiments, isolation structure 101 of semiconductor structure 100 comprises a layer or region 111, cavities 113, a capping structure 115, and portions of a layer 119. Region 111 may comprise a dielectric material and may include structures 121, and structures 121 in some embodiments may comprise a dielectric material, a semiconductor material, or a combination of dielectric and semiconductor materials. Structures 121 may be, for example, pillars, columns, or walls formed in or from portions of semiconductor material 125, and structures 121 may be referred to as vertical structures and in embodiments wherein structures 121 are formed of a dielectric material, structures 121 may be referred to as dielectric structures. Isolation structure 101 may be referred to as a dielectric platform (DP), a dielectric structure, a dielectric region, or a termination structure.

In some embodiments, structures 121 may be elongated walls and may also be referred to as protrusions, projections, or partitions. Structures 121 may comprise silicon dioxide and may be referred to as dielectric structures in these embodiments.

Cavities 113 may also be referred to as voids, gaps, air gaps, openings, trenches, empty regions, empty spaces, or the like. In addition, as described herein, in some embodiments, cavities 113 may be capped, covered, sealed or hermetically sealed to prevent any contamination from undesirable particles, gases, or moisture that may propagate into, or get trapped in cavities 113. When capped, cavities 113 may be referred to as a sealed cavities, sealed gaps, sealed voids, closed cells, or closed cell voids. In some embodiments, sealed cavities 113 are evacuated to a pressure less than atmospheric pressure. In other words, the pressure in sealed cavities is below atmospheric pressure. As an example, the pressure in cavities 113 may range from approximately 0.1 Torr to approximately 10 Torr. The type of substance or material within sealed cavities 113 is not a limitation of the claimed subject matter. For example, sealed cavities 113 may contain a solid material or a fluid such as a liquid or a gas.

Capping structure 115 is formed over and between upper portions of region 111 and cavities 113 to form sealed seals cavities 113. By way of example, capping structure 115 has a thickness ranging from about 1,000 Angstroms (Å) to about three microns ($\mu$m). Capping structure 115 is also referred to as a capping layer, and may comprise, for example, a dielectric material. Layer 115 may be an updoped or doped dielectric material.

As will be discussed further below, in some embodiments, dielectric material 115 may be heated to a predetermined temperature to flow or soften layer 115 to seal, hermetically seal, cover, close, or enclose cavities 113. In other words, layer 115 may be heated to seal cavities 113, thereby forming sealed cavities 113. In some embodiments, layer 115 may be a doped glass. For example, layer 115 may be a doped silicate glass such as, for example, phosphosilicate glass (PSG), borosilicate glass (BSG), or borophosphosilicate glass (BPSG). In other embodiments, layer 115 may be an oxide that is doped during or after deposition. For example, layer 115 may be an oxide formed using a deposition process such as, for example, plasma enhanced chemical vapor deposition (PECVD), and the oxide may be doped during or after deposition with an impurity material such as, for example, boron or phosphorus. Doping a semiconductor material or a dielectric material with an impurity material such as, for example, phosphorous or boron, or both, can result in a lower viscosity for the material at a given temperature. For example, pure or updoped oxide can flow in the temperate range of about 1,300 degrees Celsius (° C.) to about 1,400° C. and oxide doped with a 4 to 8 weight percentage (%) of phosphorous can flow at about 1,000° C. BPSG can achieve a relatively lower flow temperate of, for example, around 900° C. for a 4 to 5 weight percentage of boron and a 4 to 5 weight percentage of phosphorous. Accordingly, the impurity material alters the reflow characteristics so that the doped dielectric material can be heated to reduce the viscosity of the doped dielectric material to seal cavities 113. The flow or reflow process can be performed in atmospheric pressure, vacuum or other ambient which would then make up the ambient within sealed cavities 113.

Although layer 115 has been described as a doped dielectric material, the methods and apparatuses described herein are not limited in this regard. In other embodiments, layer 115 may be a doped or an undoped dielectric material such as, for example, spin-on glass (SOG).

In some embodiments, due to the relatively small openings between the upper portions of region 111, capping structure 115 may enter into a region above cavities 113, but not fill cavities 113. In some embodiments, sealed cavities 113 may be multiple cavities that are physically isolated from each other. The multiple cavities may be laterally bounded by walls or partitions such as structures 121. Accordingly, if capping structure 115 or isolated structures 121 experience a rupture or fracture, this rupture or fracture may be contained in a limited area of isolation structure 101 due to the physical isolation of the multiple cavities from each other. For example, a closed cell configuration would prevent a fracture or rupture from introducing gas into all of the multiple cavities of isolation structure 101.

Although multiple cavities 113 are described with reference to FIG. 1, the methods and apparatuses described herein are not limited in this regard. In other embodiments, epitaxial layer 129 and/or substrate 127 may be etched in such as way as to form a single cavity. For example, structures 121 may be pillars or columns, and accordingly, a single cavity may be realized. In addition, epitaxial layer 129 and/or substrate 127 may be etched in such a way so that isolation structure 101 has greater or fewer cavities than are shown in FIG. 1.

Although isolation structure 101 has been shown as having cavities, the methods and apparatuses described herein are not limited in this regard. In other embodiments, isolation structure 101 may be filled with one or more dielectric materials (not shown) such as, for example, an oxide, a nitride, or undoped polysilicon. Isolation structure 101 has sidewalls 139 and 141 that are perpendicular, or substantially perpendicular, to top surface 131 of layer 129. Sidewall 139 may serve as termination for field lines such as, for example, equipotential lines, during depletion of active device 102. Thus, equipotential lines may impinge on sidewalls 139 during operation of active device 102. In other words, isolation structure 101 may provide termination for equipotential lines from an electric field generated during operation of active device 102 which is adjacent to isolation structure 101. It may be desirable for sidewall 139 to be straight, or substantially straight, and smooth so that the equipotential lines are substantially perpendicular to sidewall 139 to achieve a condition referred to as planar breakdown where equipotential lines terminate at a perpendicular angle, or a substantially perpendicular angle, to sidewall 139. Equipotential lines that impinge on sidewall 139 at an angle that is not perpendicular to sidewall 139 may decrease the breakdown voltage of active device 102.

In some embodiments, the depth or thickness of isolation structure 101 may range from about one μm to about 100 μm and the depth of isolation structure 101 may be measured from top surface 131 of layer 129 to a lower boundary or surface 90 of isolation structure 101. In some embodiments, lower or bottom surface 90 of isolation structure 101 is parallel to, or substantially parallel to top surface 131 of layer 129. In some embodiments, lower surface 90 of isolation structure 101 is at a distance of at least about one μm or greater below top surface 131 and the width of isolation structure 101 is at least about three μm or greater. In other embodiments, lower surface 90 of isolation structure 101 is at a distance of at least about three μm or greater below top surface 131 and the width of isolation structure 101 is at least about five μm or greater. In one example, the thickness of isolation structure 101 may be about ten μm and the width of isolation structure 101 may be about ten μm. In yet other embodiments, it may be desirable that the thickness of isolation structure 101 be equal to, or approximately equal to, the thickness of semiconductor material 125, for example, the thickness of the semiconductor die, and the width of isolation structure 101 may be up to about one hundred μm. The thickness and width of isolation structure 101 may be varied depending on the application for isolation structure 101 and the desired die size of the resulting semiconductor device that uses semiconductor material 125. For example, a relatively thicker isolation structure 101 may be desired in applications where isolation structure 101 is used to form high Q passive devices compared to an application where isolation structure 101 is used for isolation.

In one or more embodiments, isolation structure 101 is capable of isolating one or more transistor types from one or more other transistor types, and/or to isolate different regions of semiconductor material 125 including surrounding and/or enclosing one or more areas of semiconductor material 125. In some embodiments, isolation structure 101 is a continuous or contiguous structure that surrounds one or more portions of active device 102. For example, in one or more embodiments, isolation structure 101 may have a ring, annular, or circular type shape capable of enclosing or at least partially enclosing an area or region within the ring, to isolate the inner region of the ring from the outer region of the ring. In such an embodiment, one or more portions of active device 102, such as, for example, source region 145 or channel region 159 of FET 102, may be disposed within the interior of the ring formed by isolation structure 101 to be physically and/or electrically isolated from another active region or active device disposed exterior to the ring formed by isolation structure 101. Likewise, isolation structure 101 may comprise other various shapes and/or forms to provide isolation between two or more adjacent regions of semiconductor material 125, and the scope of the claimed subject matter is not limited in this respect. For example, isolation structure may be rectangular shaped, square shaped, oval shaped, etc.

In some embodiments, the height of structures 121 is equal to, or approximately equal to, the height of the tallest portion of region 111. For example, if lower surface 90 of region 111 is about three μm below top surface 131, then structures 121 may have a height of about three μm or greater. In other words, if lower surface 90 of region 111 is at least about three μm or greater from top surface 131, then structures 121 extend a distance of at least about three μm or greater from lower surface 90 of region 111. In one example, lower surface 90 extends to a distance of about one μm from top surface 131 and structures 121 have a height of about one μm. Although structures 121 are illustrated as having a height that is approximately equal to the depth or thickness of region 111, this is not a limitation of the claimed subject matter. In other embodiments, the height of structures 121 may be greater than, or less than, the thickness of region 111. For example, region 111 may extend a distance of at least about ten μm below top surface 131 and the structures 121 that are internal or central within isolation structure 101 may extend a distance of about seven μm from lower surface 90.

Cavities 113 abut region 111. In embodiments where region 111 is a dielectric region, the combination of dielectric material 111 and sealed cavities 113 reduces the overall permittivity of isolation structure 101 so that isolation structure 101 has a relatively low dielectric constant. In other words, the combination of dielectric material 111 and sealed cavities 113 results in isolation structure 101 having a relatively low or reduced dielectric constant. To minimize the dielectric constant of isolation structure 101, it is desirable to increase the depth of isolation structure 101, increase the volume of sealed cavities 113, and reduce the amount of conductive or semiconductor material contained in region 111. In some embodiments, a dielectric constant of at least about 1.5 or lower may be achieved by increasing the volume of sealed cavities 113.

The dielectric constant of isolation structure 101 is reduced compared to, for example, what would be provided by an isolation structure that has no cavities or voids. The dielectric constant of isolation structure 101 may also be reduced by increasing the volume of dielectric material in region 111. Silicon dioxide has a dielectric constant of about 3.9. Accordingly, a solid or filled isolation structure that includes no cavities and includes silicon dioxide may have a dielectric constant of about 3.9. Since empty space has the lowest dielectric constant (the dielectric constant of empty space is 1), the more empty space or void space incorporated into the isolation structure, the lower the overall dielectric constant. Accordingly, increasing the volume of sealed cavities 113 relative to the volume of region 111 is more effective in decreasing the dielectric constant of isolation structure 101 compared to increasing the volume of dielectric material in region 111.

Additionally, less stress is induced in layers 129 and 127 by isolation structure 101 compared to a solid or filled dielectric structure, because isolation structure 101 includes substantial volumes that are not occupied by solids having coefficients of thermal expansion that differ from that of layers 129 and 127. A solid or filled isolation structure (not shown) that includes, for example, an oxide material with no cavities may generate stress in an adjacent silicon region during heating and cooling of the isolation structure and the silicon region due to the coefficient of thermal expansion (CTE) mismatch between silicon and oxide. Accordingly, the stress on the silicon lattice may lead to defects or dislocations in the silicon region. The dislocations may lead to undesirable excessive leakage currents in active devices, such as transistors or diodes, formed adjacent to isolation structure 101, and therefore, forming an isolation structure such as isolation structure 101 which has sealed cavities 113, can reduce or prevent the formation of dislocations in the adjacent active regions, such as the active region where active device 102 is formed, since sealed cavities 113 can provide relief for the stress. Furthermore, less stress is generated in the formation of isolation structure 101 compared to a solid or substantially solid isolation structure in which the solid or substantially solid regions are formed by oxidation because, for example, in silicon, oxidation is accompanied by a 2.2 times volume increase.

In some embodiments described herein, isolation structure 101 includes one or more cavities occupying in excess of 40% of the total volume of isolation structure 101. This may result in an effective dielectric constant reduction of about 30% or greater, from a dielectric constant of about 3.9 to an effective dielectric constant of about 2.74. In one embodiment, isolation structure 101 includes one or more cavities occupying in excess of 50% of the total volume. This may result in an effective dielectric constant reduction of about 39%, from a dielectric constant of about 3.9 to an effective dielectric constant of about 2.39. Increasing the volume of air or empty space in isolation structure 101 may result in isolation structure 101 having a dielectric constant of about 1.5 or less. As a result, passive elements formed over isolation structure 101 have reduced parasitic capacitances to layers 129 and 127. The parasitic substrate capacitance is reduced by both the reduced effective dielectric constant of isolation structure 101 and the increased thickness of isolation structure 101.

In addition, isolation structure 101 may be used to increase the frequency of operation of any devices formed using semiconductor structure 100. For example, passive components such as, for example, inductors, capacitors, or electrical interconnects, may be formed over embedded isolation structure 101 and may have reduced parasitic capacitive and inductive coupling between these passive components and semiconductor material 125 since embedded isolation structure 101 has a relatively low dielectric constant or permittivity and since embedded isolation structure 101 increases the distance between the passive components and the conductive layers 127 and 129. Passive components may also be referred to as passive devices or passive circuit elements. Reducing parasitic substrate capacitances may increase the frequency of operation of any devices formed using an isolation structure such as isolation structure 101. As an example, the passive component may comprise an electrically conductive material such as, for example, aluminum, copper, doped polycrystalline silicon, silicide, gold, nickel, or permalloy. In various examples, the passive component may be an inductor, a capacitor, a resistor, an electrical interconnect, or a combination thereof and may be coupled to one or more active devices such as, for example, active device 101.

Since at least a portion of isolation structure 101 is formed in and below the surface of a semiconductor base layer or material, such as, layer 129, isolation structure 101 may be referred to as an embedded isolation structure. Embedded may mean that at least a portion of isolation structure 101 is below a plane (not shown) that is coplanar to, or substantially coplanar to, top surface 131 of layer 129. In some embodiments, the portion of isolation structure 101 below the plane extends from the plane to a depth of at least about three μm or greater below the plane and the portion of isolation structure 101 below the plane has a width of at least about five μm or greater. In other words, at least a portion of isolation structure 101 is embedded in semiconductor layer 129 and extends a distance of at least about three μm or greater from top surface 131 toward the bottom surface 133 and the portion of isolation structure 101 embedded in semiconductor material 125 has a width of at least about five μm or greater in some embodiments. In some embodiments, a majority of isolation structure 101 is below top surface 131. In other embodiments, all of, or substantially all of, isolation structure 101 is below top surface 131. In some embodiments, isolation structure 1010 extends to a level below epitaxial layer 149. Also, in some embodiments, isolation structure 101 extends through epitaxial layer 129 and into substrate 127. In other words, at least a portion of isolation structure 101 extends to a level below the bottom surface of epitaxial layer 129. This may be advantageous for achieving planar breakdown, as the equipotential lines in epitaxial layer 129 may terminate on sidewall 139 of isolation structure 101.

Further, isolation structure 101 may be used to form relatively high quality passive devices such as, for example, capacitors and inductors having a relatively high Q since isolation structure 101 may be used to isolate and separate the passive devices from semiconductor base layers 127 and 129. Active devices, such as active device 102, may be formed in regions adjacent to, or abutting, isolation structure 101, and these active devices may be coupled to passive components such as spiral inductors, interconnects, microstrip transmission lines and the like that are formed on, or over, a top or upper surface of isolation structure 101. Increasing the distance between the passive components and semiconductor layers 127 and 129 allows higher Qs to be realized for these passive components.

As is discussed below, active device 102 is formed in and/or from semiconductor material 125. In some embodiments, semiconductor material 125 may include one or more epitaxial layers. Semiconductor layer 129 may comprise silicon which is epitaxially grown on silicon substrate 127 and layer 129 may be referred to as a device layer or an active layer. Substrate 127 may also be referred to as a semiconductor substrate. Active device 102 may be formed using conventional complementary metal oxide semiconductor (CMOS) processes.

In some embodiments, active device 102 is a vertical field effect transistor (FET) that includes a source region 145, a drain region that includes regions or layers 147, 149, 129, and 127, a gate oxide 153, a gate 155 over portions of gate oxide 153, and a doped region 157 formed in a portion of a doped region 147, wherein portions of doped region 157 between source region 145 and drain region 147 and under gate oxide 153 serve as a channel region for vertical FET 102. The portion of doped region 157 that serves as a channel region for vertical FET 102 is labeled 159. The source, drain, and channel regions of a FET can be formed by forming doped regions in a semiconductor material and therefore the source, drain and channel regions of a FET may be referred to as doped regions. A source contact or electrode 161 may be formed on or adjacent to an upper surface of layer 129 and a drain electrode (not shown) may be formed on or adjacent to lower surface 133 of substrate 127.

FET 102 may be referred to as vertical FET since during operation, the electrical current flow from source electrode 161 to the drain electrode in the vertical transistor may be substantially perpendicular to the upper and lower surfaces of semiconductor material 125. In other words, current flows essentially vertically from source electrode 161 located adjacent a top surface of semiconductor material 129 to a drain electrode located adjacent to the opposite bottom surface 133 of semiconductor material 127. FET 102 is asymmetric in that the source and drain regions of FET 102 are not interchangeable, and therefore, FET 102 may be referred to as an asymmetric, unilateral, or unidirectional transistor. Compare this to, for example, the P-channel FET (not shown) and N-channel FET (not shown) of a CMOS device (not shown) that has source and drain regions that are interchangeable, and therefore, the P-channel and N-channel FETs of a CMOS device may referred to as symmetrical, bilateral, or bidirectional transistors.

Power transistors having relatively high breakdown voltages, and consequently relatively high output power, may be realized by forming a vertical transistor in an active area adjacent to an isolation structure, such as, for example, isolation structure 101. Vertical transistor 102 may be referred to as a power transistor and isolation structure 101 may provide edge termination for the equipotential lines from an electric field in the drain region of vertical transistor 102 that is adjacent to isolation structure 101. Higher breakdown voltages may be achieved as the edge termination provided by sidewall 139 of isolation structure 101 may reduce curvature of the equipotential lines. As is generally understood, curvature of the equipotential lines results in lower breakdown voltages. To maximize breakdown voltage, the equipotential lines are parallel, or substantially parallel, to top surface 131, and these equipotential lines are planar with little to no curvature.

If relatively high breakdown voltages are desired, then the sidewall 139 of isolation structure 101 that contacts or abuts the drain region of vertical transistor 102 may be formed to be a high quality dielectric material such as, for example, a thermal oxide, that is perpendicular, or substantially perpendicular, relative to top surface 131 to allow the equipotential lines to terminate substantially perpendicular at the sidewall 139 of isolation structure 101. If sidewall 139 of isolation structure 101 is angled relative to top surface 131, then this may not reduce curvature of the equipotential lines as desired.

Isolation structure 101 may be adjacent to, abutting, and/or surrounding, the active regions where portions of active device 102 are formed to provide edge termination for terminating equipotential lines during operation of vertical FET 102, which may result in relatively higher breakdown voltages for active devices formed in the active regions. In addition, if isolation structure 101 surrounds one or more active regions, then isolation structure 101 may also be used to provide electrical isolation. For example, isolation structure 101 may be used to electrically isolate active regions from each other, which may also result in electrical isolation between any active devices formed in the isolated active regions. This may be desirable in embodiments such as integrated circuit (IC) embodiments, wherein vertical FET 102 may be integrated with other passive or active devices such as, for example, complementary metal-oxide semiconductor (CMOS) devices.

It should be noted that including isolation structure 101 is optional in some embodiments. As discussed above, isolation structure 101 may be desirable in applications where high voltage and/or high power is desired. In addition, isolation structure 101 may be desirable in applications where high quality passives, reduced parasitic capacitance to the semiconductor base layers 127 and 129 are desired, and/or electrical isolation is desired.

Semiconductor structure 100 further includes dielectric layers 165, 167, 169, 171, 175, and 179. Further, semiconductor structure 100 includes conductive layers 181, 183, 185, and 187, and includes conductive electrodes or contacts 191 and 193. In addition, semiconductor structure 100 includes dielectric layer 199, dielectric spacers 195 and 197, and doped regions 205 and 207.

Conductive layer 185, and portions of conductive layer 187 that are over gate 155 and layer 185, may serve as gate interconnect layers for electrically coupling gate 155 of FET 102 to other elements of semiconductor structure 100. In some embodiments, gate 155 is an annular shaped or ring shaped element and may be referred to as an annular gate, a sidewall gate, a spacer gate, or a vertical gate. The channel length of vertical FET 102 is set by the deposition thickness of gate 155 rather than the lithographic limitations of the semiconductor lithography tools. In other words, the channel length of the vertical FET 102 is a function of the gate length of gate 155 of FET 102 which is substantially equal to the deposition thickness of the material used to form gate 155 of FET 102 and is not dependent on lithographic dimensions. Thus, the channel length can be reliably and repeatably controlled without using lithographic techniques. The channel length of FET 102 is relatively smaller than that of a FET that has a lithographic defined gate which has a channel length that is dependant on the lithographic limitations of the lithography equipment used to form the lithographic defined gate. A relatively smaller channel length results in a faster FET that has a relatively higher frequency of operation. The relatively higher frequency of operation of FET 102 is achieved at least in part since the relatively shorter channel length results in a relatively smaller amount of charge that is modulated during operation.

As will be discussed below, channel region 159 may be formed to have a substantially uniform doping profile. A uniform doping profile can result in increased linearity, high Early voltage, and a stable threshold voltage for FET 102.

Conductive electrode 191 is electrically coupled to gate 155 via conductive layers 185 and 187 and may serve as a gate contact. Electrodes 161, 191, and 193 may also be referred to as electrical contacts or electrical interconnect structures. Dielectric spacers 195 prevent electrical shorting between gate 155 and conductive layers 181 and 183.

Dielectric layer 175 may be referred to as an intermetal dielectric (IMD) layer or an interlayer dielectric (ILD) layer, and dielectric layer 179 is a passivation layer that can be formed over exposed portions of ILD layer 175 and electrodes 161, 191, and 193. Openings 211, 213, and 215 can be formed in passivation layer 179 to expose electrodes 193, 161, and 191, respectively. The number of openings formed in passivation layer 179 is not a limitation of the claimed subject matter.

Conductive layers 181 and 183 may serve as Faraday shield layers for FET 102, which can be used to reduce gate-to-drain parasitic capacitance. In other words, electrically conductive shield layers 181 and 183 can be used to reduce parasitic capacitive coupling between gate electrode interconnect layers 185 and 187 and the drain regions 147, 149, 129, and 127 of the vertical FET 102. Although not shown, electrically conductive shield layers 181 and 183 can be electrically coupled to ground, and can be coupled to source region 145, which may also be electrically coupled to ground. At least a portion of conductive layers 181 and 183 can be formed between at least a portion of gate interconnect layers 185 and 187 and at least a portion of semiconductor regions 147, 149, 129, and 127, and this configuration can reduce parasitic capacitive coupling between gate interconnect layers 185 and 187 and semiconductor regions 147, 149, 129, and 127, thereby reducing gate-to-drain capacitance in vertical FET 102. Reducing gate-to-drain capacitance in vertical FET 102 can increase the speed or operating frequency of vertical FET 102. Shield layers 181 and 183 may also be referred to as a gate shield.

Vertical FET 102 may be a high power, high voltage transistor such that during operation, an external bias signal such as, for example, a voltage ranging from about 20 volts to about 100 volts, from an external source (not shown), can be coupled to drain regions 147, 149, 129, and 127 via a drain contact (not shown) that is coupled to lower surface 133 of substrate 127. An external bias signal such as, for example, a voltage ranging from about one volt to about four volts, from an external source (not shown), can be coupled to gate 155 of FET 102 via gate contact 191 and gate interconnect layers 185 and 187. An external bias signal such as, for example, ground, can be coupled to source region 145 via source contact 161.

As discussed above, vertical FET 102 may be referred to as a high voltage transistor or a power transistor. A power transistor is a device that may be capable of handling a relatively large amount of electrical current such as, for example, at least about 100 milliamps (mA) of electrical current in some embodiments. In addition a power transistor is a device that can be coupled to relatively large operating voltage potentials of, for example, at least about 20 volts to over 100 volts, and may be used in power amplifiers to generate at least about one watt of output power.

Although the scope of the claimed subject matter is not limited in this respect, in some embodiments, FET 102 is a radio frequency (RF) power transistor constructed to operate at frequencies of greater than about one megahertz (MHz) and to have an output power greater than about one watt. RF power transistors can be used in RF power amplifiers that may be used in wireless communications applications such as, for example, cellular base stations, high frequency (HF), very high frequency (VHF) and ultra high frequency (UHF) broadcast transmitters, microwave radar systems, and avionics systems. Some RF power amplifiers (RFPAs) provide from about five watts (W) to more than about 200 W of output power. In some embodiments, FET 102 is a RF power transistor adapted to operate at frequencies of greater than about 500 megahertz (MHz) and has an output power greater than about five watts.

Although only a single active device 102 is discussed as being formed in semiconductor structure 100, the methods and apparatuses described herein are not limited in this regard. In some embodiments, a plurality of active devices may be formed in semiconductor structure 100. For example, although not shown, multiple vertical FETs having the same structure or configuration as vertical FET 102 may be formed in semiconductor structure 100, wherein the gates of each vertical FET may be coupled together, each of the sources of each vertical FET may be coupled together, and each of the drains of each vertical FET may be coupled to each other so that the multiple FETs are coupled together to function as a single transistor. In these embodiments, the multiple FETs are coupled together to function as a discrete transistor.

After isolation structure 101 and active device 102 are formed, the wafer or die comprising semiconductor structure 100 can be thinned. In other words, a lower portion of substrate 127 can be removed using wafer thinning techniques such as, for example, grinding.

Figure 2:
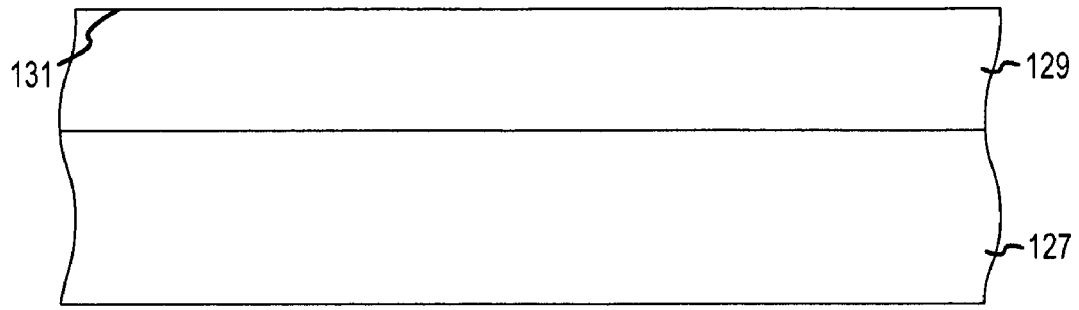
FIG. 2 is a cross-sectional view of the semiconductor structure of FIG. 1 at an earlier stage of manufacture.

FIG. 2 is a cross-sectional view of semiconductor structure 100 (FIG. 1) at a beginning or earlier stage of manufacture. Substrate 127 comprises a semiconductor material such as, for example, silicon doped with an impurity material of n-type conductivity such as, for example, phosphorous, arsenic, or antimony. In one or more embodiments, the resistivity of substrate 127 ranges from about 0.001 ohm-centimeters ($\Omega$-cm) to about 0.003 $\Omega$-cm, although the methods and apparatuses described herein are not limited in this regard. The conductivity type of substrate 127 is not limited to being n-type conductivity, as substrate 127 can be p-type conductivity in other embodiments. An impurity material is also referred to as a dopant or impurity species. What is shown in FIG. 2 is substrate 127, which may be used as a substrate for the fabrication of semiconductor structure 100 (FIG. 1). Substrate 127 may have a thickness ranging from about 100 µm to about 1,000 µm. However, the thickness of substrate 127 may be reduced through subsequent thinning processes in some embodiments.

Epitaxial layer 129 may be n-type conductivity, and in some embodiments, the resistivity of epitaxial layer 129 may range from about one $\Omega$-cm to about five $\Omega$-cm, although the methods and apparatuses described herein are not limited in this regard. The resistivity of epitaxial layer 129 may be selected to achieve a desired breakdown voltage for FET 102 (FIG. 1) and a desired drain-to-source on resistance ($R_{DSON}$) for FET 102. Epitaxial layer 129 may have a thickness ranging from about five microns to about 100 microns.

Figure 3:
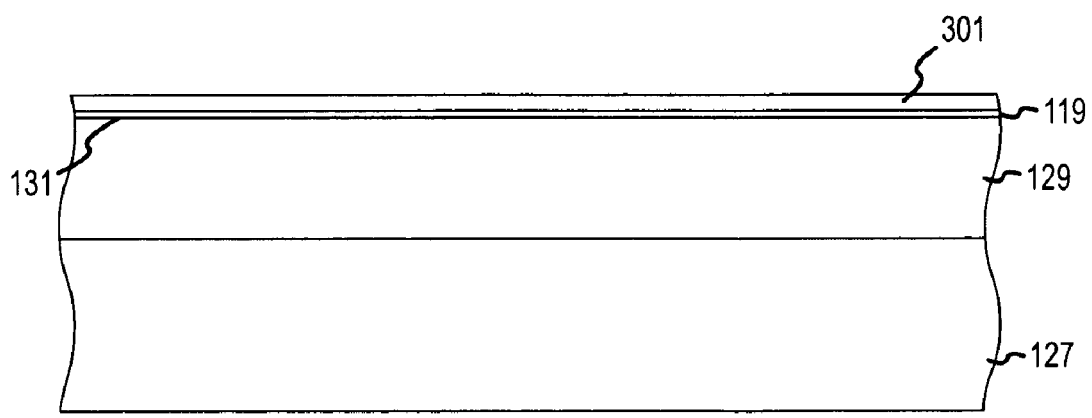
FIG. 3 is a cross-sectional view of the semiconductor structure of FIG. 2 at a later stage of manufacture.

Turning to FIG. 3, a layer of dielectric material 119 is formed on or over epitaxial layer 129. Layer 119 may comprise, for example, silicon dioxide ($SiO_2$) and may have a thickness ranging from about 500 Å to about 2,000 Å. Dielectric layer 119 may be formed using deposition techniques or thermal growth techniques such as, for example, thermal oxidation of silicon. For example, a thermal oxidation process may be performed to convert an exposed portion of epitaxial layer 129 to silicon dioxide, thereby forming silicon dioxide layer 119.

A layer of dielectric material 301 may be formed on dielectric layer 119. Layer 301 may comprise, for example, silicon nitride (Si$_3$N$_4$) and may have a thickness ranging from about 500 Å to about 2,000 Å. Dielectric layer 301 may be formed using low pressure chemical vapor deposition (LPCVD), although other methods of deposition for layer 301 may be used in other embodiments.

Figure 4:
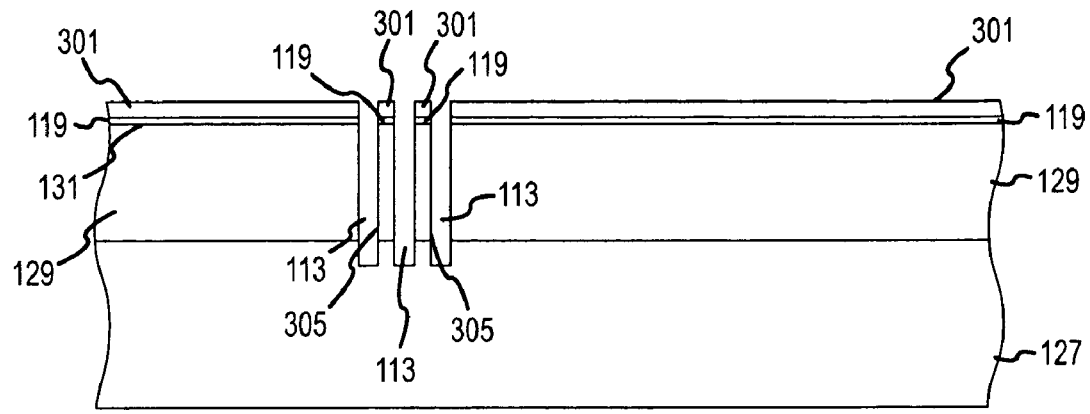
FIG. 4 is a cross-sectional view of the semiconductor structure of FIG. 3 at a later stage of manufacture.

Referring now to FIG. 4, portions of nitride layer 301, oxide layer 119, epitaxial layer 129 and substrate 127 can be removed using photolithography and etching processes to pattern the structure shown in FIG. 3. In other words, portions of nitride layer 301, oxide layer 119, epitaxial layer 129 and substrate 127 can be removed to form cavities 113 and structures 305 between cavities 113 using a photomask (not shown) and one or more etch operations. The photomask may be a layer of photoresist. Structures 305 may comprise portions of layers 301, 119, 129, and 127.

For example, the portions of silicon nitride layer 301 exposed by the photomask (not shown) can be etched with an etch chemistry that preferentially etches silicon nitride. After etching through silicon nitride layer 301 and exposing portions of oxide layer 119, the etch chemistry can be changed to one that preferentially etches oxide, and after the oxide is etched the etch chemistry can be changed to one that preferentially silicon if layers 129 and 127 comprise silicon. Anisotropic reactive ion etching (RIE) can be used to etch layers 301, 119, 129, and 127 to form cavities 113 and structures 305.

In some embodiments, cavities 113 and structures 305 may be formed using at least one etch operation to remove portions of layers 301, 119, 129, and 127. In other embodiments, more than one etch operation, for example, two or three etching operations may be used to remove portions of layers 301, 119, 129, and 127. In one example, one etch operation may be used to remove portions of layers 301, 119, 129, and 127. As another example, three etch operations may be used to remove portions of layers 301, 119, 129, and 127.

Silicon nitride layer 301 may be etched using a wet chemical etch or a dry etch process such as, for example, a reactive ion etch (RIE). Silicon dioxide layer 119 may be etched using a wet chemical etch or a dry etch process such as, for example, a reactive ion etch (RIE). Semiconductor layers 129 and 127 may next be removed using an etch process such as, for example, a deep reactive ion etching (RIE) process.

The method for etching layers 301, 119, 129, and 127 are not limitations of the claimed subject matter. For example, wet etching techniques or isotropic etching techniques can be used to etch layers 301, 119, 129, and 127. Although the methods and apparatuses described herein are not limited in this regard, in some embodiments, cavities 113 extend through epitaxial layer 129 and into substrate 127. In other words, cavities 113 can extend to a depth that is greater than epitaxial layer 129.

In one or more embodiments, cavities 113 extend from about one micron to about 100 microns (μm) below top surface 131, each cavity 113 may have a width of about 0.5 micron to about three microns and each structure 305 may have a width of about 0.25 micron to about two microns. Cavities 113 and structures 305 can also have other depths and widths. Structures 305 can have various shapes. For example, structures 305 can be pillars, columns, or walls, and may be referred to as partitions, protrusions, projections, or vertical structures. The photomask (not shown) used to form cavities 113 and structures 305 can be removed or stripped after forming cavities 113 and structures 305.

Figure 5:
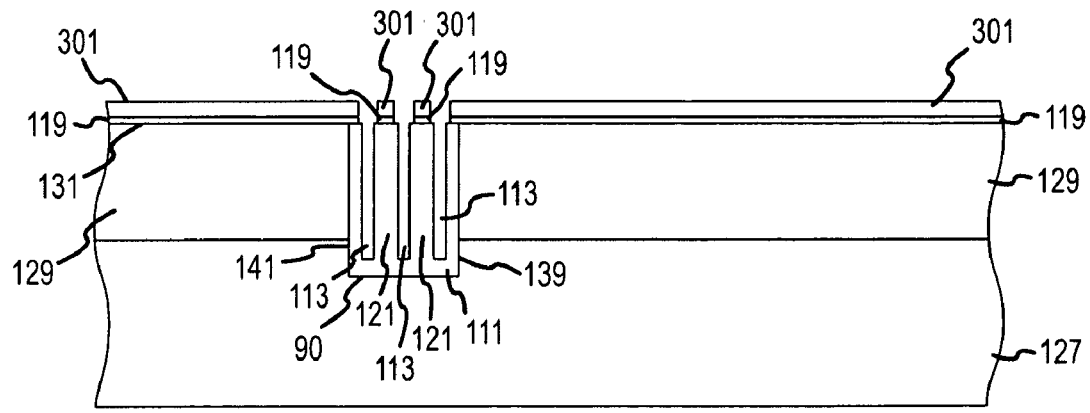
FIG. 5 is a cross-sectional view of the semiconductor structure of FIG. 4 at a later stage of manufacture.

FIG. 5 is a cross-sectional view of a semiconductor structure 100 at a later stage of manufacture. A thermal oxidation process is performed so that the exposed silicon of structure 100 is converted to silicon dioxide, thereby forming a silicon dioxide layer or region 111 which includes silicon dioxide structures 121. In particular, the silicon of silicon structures 305 (FIG. 4) may be partially, or in the embodiment illustrated in FIG. 5, completely converted to silicon dioxide to form silicon dioxide structures 121. In other words, the silicon between the sidewalls of structures 305 (FIG. 4) may be substantially converted to silicon dioxide in some embodiments. In addition, as shown in FIG. 5 during the thermal oxidation process, the bottom or floor of cavities 113 is also converted to silicon dioxide to form the lower portion of region 111. Since the dielectric constant of silicon is greater than the dielectric constant of silicon dioxide, reducing the amount of silicon in region 111 will reduce the effective dielectric constant of isolation structure 101 (FIG. 1).

About 2.2 units of silicon dioxide are formed from about one unit of silicon during thermal oxidation. In other words, about 2.2 Å of thermal oxide may be formed from about one Å of silicon. As a result, the formation of silicon dioxide during the thermal oxidation process illustrated with reference to FIG. 5 has the effect of decreasing the spacing between structures 305 (FIG. 4). Thus, the width of cavities 113 is reduced due to the thermal oxidation process.

Figure 6:
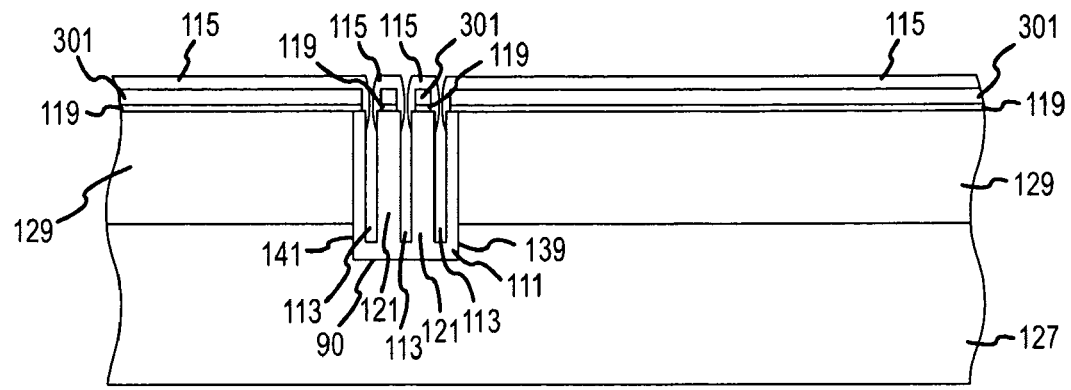
FIG. 6 is a cross-sectional view of the semiconductor structure of FIG. 5 at a later stage of manufacture.

Accordingly, subsequent capping of cavities 113 may be facilitated by the thermal oxidation process. In particular, as a result of the thermal oxidation process, the spacing between the upper portions of dielectric region 111 is decreased to a distance that will facilitate capping or sealing of cavities 113 using, for example, a non-conformal dielectric material such as, for example, capping material 115 (FIG. 6). In addition, the effective dielectric constant of the resulting isolation structure 101 (FIG. 1) is reduced due to thermal oxidation process which decreases the amount of silicon material in isolation structure 101.

Although the thickness or the amount of the silicon dioxide of the central or internal silicon dioxide structures 121 is limited after all of the silicon of structures 305 (FIG. 4) is consumed during the thermal oxidation process, the thermal oxidation process may continue longer to increase the thickness of the silicon dioxide at the lateral and lower boundaries of dielectric region 111. In other words, the oxidation process may continue longer to increase the amount of silicon dioxide at the bottom of cavities 113 and along the lateral perimeter of dielectric region 111.

Referring now to FIG. 6, a material 115 is formed over silicon nitride layer 301 and along upper portions of dielectric region 111. Material 115 can be referred to as a sealing layer, sealing material, capping layer, or capping material. In some embodiments, capping material 115 is a doped dielectric material such as, for example, a doped glass or a doped oxide. Suitable doping or impurity materials for capping material 115 include boron, arsenic, phosphorus, or indium. The impurity material can be added during or after the deposition of the dielectric material. As discussed above, the impurity material can alter the flow or reflow characteristics of the doped dielectric material.

In some embodiments, capping material 115 may be phosphosilicate glass (PSG), borosilicate glass (BSG), or borophosphosilicate glass (BPSG). Techniques for forming capping material 115 may include chemical vapor deposition (CVD), plasma enhanced CVD (PECVD), reduced pressure CVD, sputtering, evaporation, atmospheric pressure chemical vapor deposition (APCVD), subatmospheric CVD (SACVD), or spin-on deposition. In some embodiments, doped dielectric material 115 is PSG having a phosphorus concentration that ranges from about 4 percent to about 8 percent. In other embodiments, layer 115 may be an oxide that is doped during or after deposition. For example, layer 115 may be an oxide formed using a deposition process such as, for example, plasma enhanced CVD (PECVD), and the oxide may be doped during or after deposition with an impurity material or dopant such as, for example, boron or phosphorus. Doping a material with an impurity material such as, for example, phosphorous or boron, or both, can result in a lower viscosity for the material at a given temperature. Although material 115 has been described as a doped dielectric material, the methods and apparatuses described herein are not limited in this regard. In other embodiments, material 115 may be a doped or an undoped dielectric material such as, for example, spin-on glass (SOG). In other embodiments, capping material 115 may be any material capable of being reflowed including, but not limited to, polymeric materials. In some embodiments, capping material 115 may have a thickness ranging from about one micron to about three microns.

Although not shown, in some embodiments, capping material 115 may be formed by doing more than one deposition of a doped dielectric material. For example, an initial layer of a non-conformal, doped dielectric material may be formed over silicon nitride layer 301 and along upper portions of dielectric region 111. Then a densification process may be performed to remove unreacted gases, water, and other materials that may be present in the doped dielectric material. The densification process may include heating structure 100 for one hour at a temperature of 950° C. After the densification process, another layer of a non-conformal, doped dielectric material may be formed on the initial layer of non-conformal, doped dielectric material so that the combined layers have a thickness ranging from about one micron to about three microns.

Although not shown, in other embodiments, doped dielectric capping material 115 may be deposited in such a way to form a continuous structure after deposition. In addition, although not shown, portions of doped dielectric material 115 may be formed along the bottom surface or lower boundary of cavities 113. However, it may be desirable in some embodiments to limit or minimize the amount of material 115 that is formed along the bottom surface or lower boundary of cavities 113.

Figure 7:
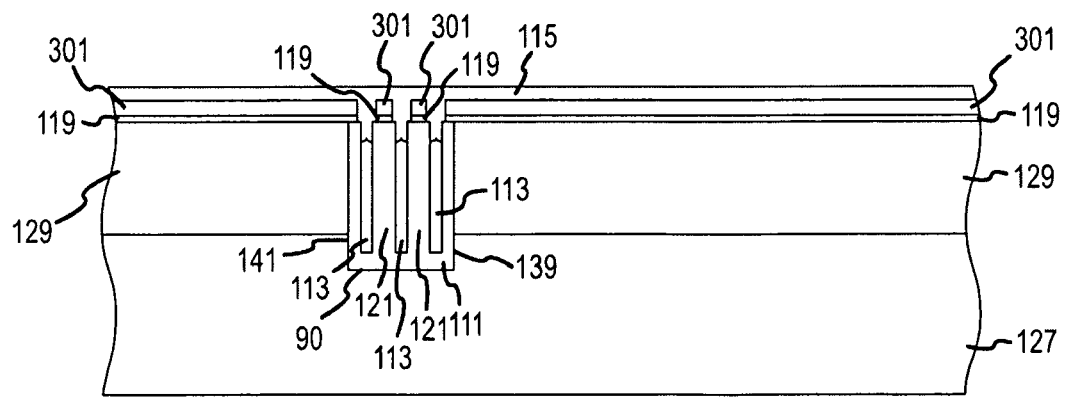
FIG. 7 is a cross-sectional view of the semiconductor structure of FIG. 6 at a later stage of manufacture.

Referring now to FIG. 7, capping material 115 is flowed or reflowed to form sealed cavities 113 and reflow layer 115. At least a portion of dielectric material 111 is between at least a portion of layer 129 and at least a portion of the doped dielectric material 115.

In some embodiments, capping material 115 may be flowed or softened by using thermal energy to cause capping material 115 to flow to seal cavities 113. For example, capping material 115 may be flowed by heating capping material 115 to a temperature sufficiently high to cause it to soften and flow. In other words, material 115 may be heated to a temperature sufficiently high for a period of time to cause it to reflow. In some embodiments, when capping material 115 is a dielectric material, capping material 115 may flow at temperatures ranging between about 950 degrees Celsius (° C.) to about 1,200° C. In one or more embodiments, capping material 115 flows at temperatures below about 1,100° C. As an example, structure 100 may be placed in a furnace and heated to a temperature ranging from about 1,000° C. to about 1,050° C. for about one hour to about five hours to flow capping material 115 and seal cavities 113. The flow or reflow process can be performed in atmospheric pressure, vacuum or other ambient which would then make up the ambient within sealed cavities 113. As discussed above, sealed cavities 113 may be formed under vacuum.

In addition, in some embodiments, the reflow process can be performed by placing structure 100 in a furnace and the ambient can have a wet steam or have some type of dopant containing gas such as, for example, nitrogen or oxygen, or a mixture of oxygen and nitrogen. Other techniques that can be used as part of the reflow process include laser assisted reflow or spike annealing.

Capping material 115 can also be called a flowable material because of its reflow properties. After capping material 115 has been reflowed, it can also be referred to as a reflow layer. It should be noted that in those embodiments in which capping material 115 is a continuous structure after deposition, reflowing may help to smooth the capping material so that the upper surface of layer 115 is planar or substantially planar.

Figure 8:
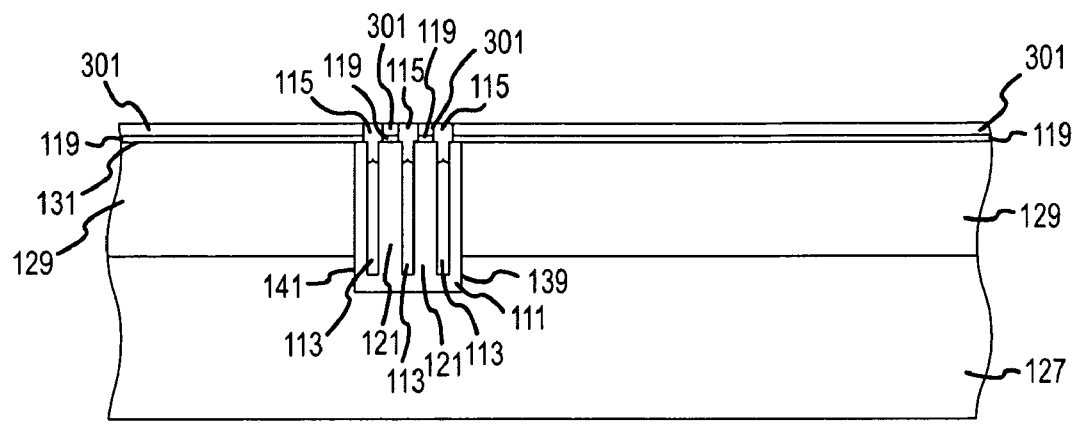
FIG. 8 is a cross-sectional view of the semiconductor structure of FIG. 7 at a later stage of manufacture.

Referring to FIG. 8, a portion of layer 115 may be removed using, for example, a Chemical Mechanical Planarization (CMP) technique. In other embodiments, a blanket etch may be used to remove the portions of layer 115 that are over silicon nitride layer 301. The blanket etch may include using an RIE etch to remove the portions of layer 115 that are above the upper surface of silicon nitride layer 301.

In some embodiments, if layer 115 is formed prior to the formation of active or passive devices, then subsequently thermal steps used to form the active or passive devices can be at a temperature(s) below the temperature where layer 115 will flow. In other words, the subsequent elements or devices, such as active or passive devices, can be formed at a temperature, or temperatures, below the temperature used to flow layer 115. For example, a sufficient quantity of dopant(s) may be added to layer 115 so that layer 115 flows at a temperature of, for example, about 1,075° C. to about 1,100° C., and then subsequent processing can be performed below 1,075° C. in this example. In this example, FET 102 (FIG. 1) can be formed after the formation of layer 115 and at temperatures lower than 1,075° C.

Figure 9:
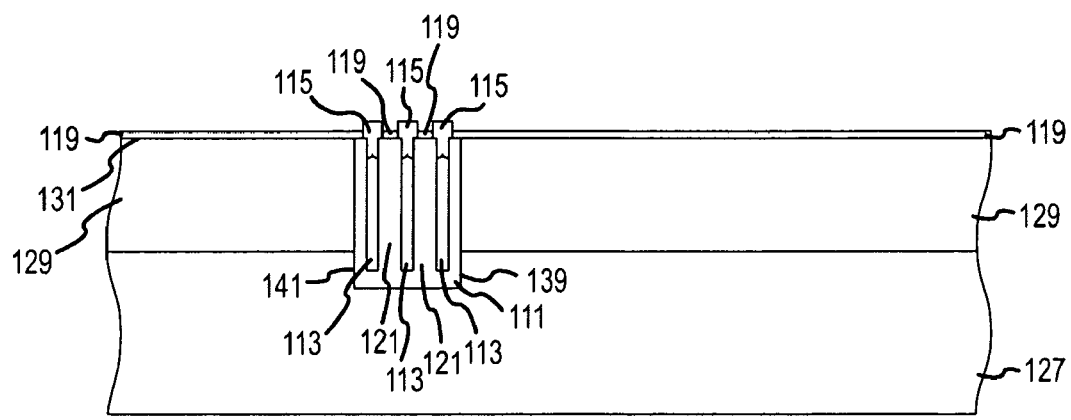
FIG. 9 is a cross-sectional view of the semiconductor structure of FIG. 8 at a later stage of manufacture.

Referring to FIG. 9, a blanket etch selective to silicon nitride may be used to remove silicon nitride layer 301 (FIG. 8). The blanket etch may include using an RIE etch to remove silicon nitride layer 301 (FIG. 8).

Figure 10:
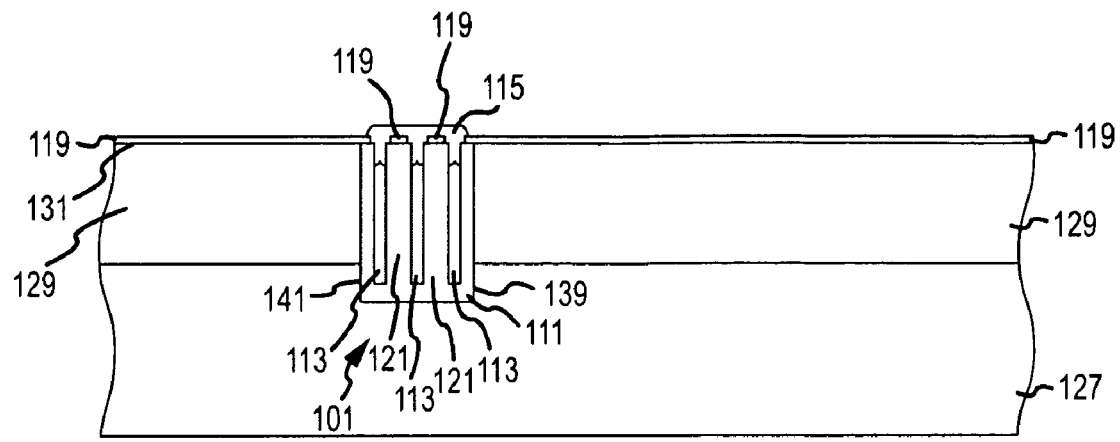
FIG. 10 is a cross-sectional view of the semiconductor structure of FIG. 9 at an earlier stage of manufacture.

Referring to FIG. 10, another heating operation may be performed to soften, flow, or reflow material 115. In some embodiments, this heating operation may include placing structure 100 in a furnace and heating structure 100 to a temperature ranging from about 1,000° C. to about 1,050° C. for about one hour to about five hours to reflow capping material 115, thereby increasing the planarity of capping material 115. The ambient for the reflow can be steam, wet oxygen, or an oxygen and nitrogen mixture.

Figure 11:
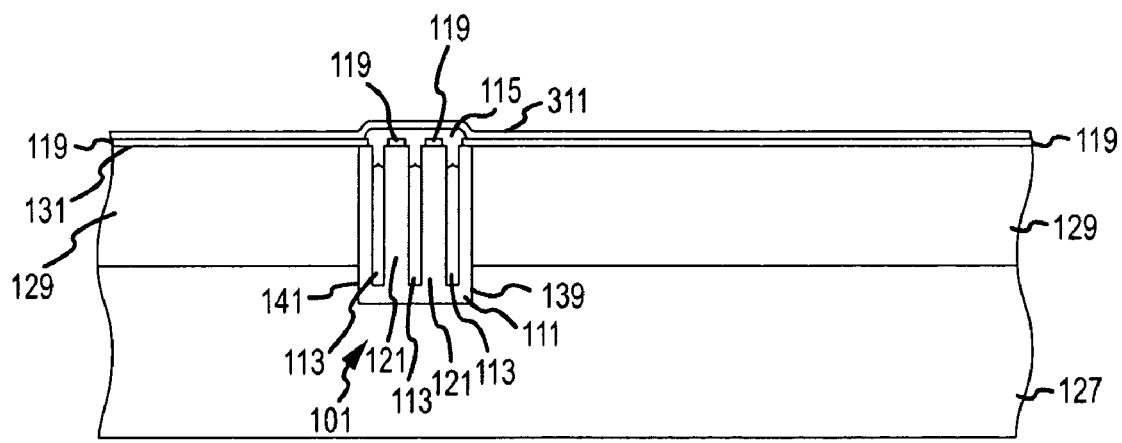
FIG. 11 is a cross-sectional view of the semiconductor structure of FIG. 10 at a later stage of manufacture.

Referring to FIG. 11, an optional sealing layer 311 such as, for example, silicon nitride ($Si_3N_4$), may be formed over silicon dioxide layer 119 and capping material 115 to hermetically seal cavities 113. In other words, the optional conformal silicon nitride layer 311 may prevent diffusion through capping structure 115, and in general prevent the propagation of gases or moisture into, or out of, cavities 113. In addition, sealing layer 311 may prevent the contamination of other materials during subsequent processing of semiconductor structure 100. For example, in embodiments where capping structure 115 is phosphosilicate glass (PSG), silicon nitride layer 311 can prevent phosphorous from PSG structure 115 from contaminating other materials such as, gate oxide layer 153 (FIG. 1) during subsequent processing of semiconductor structure 100.

Silicon nitride layer 311 may be formed using a low pressure chemical vapor deposition (LPCVD) technique and may have a thickness ranging from about 1,000 Å to about 2,000 Å. In other embodiments, sealing layer 311 may be LPCVD low temperature oxide (LTO), LPCVD high temperature oxide (HTO), LPCVD TEOS, or LPCVD PSG.

Figure 12:
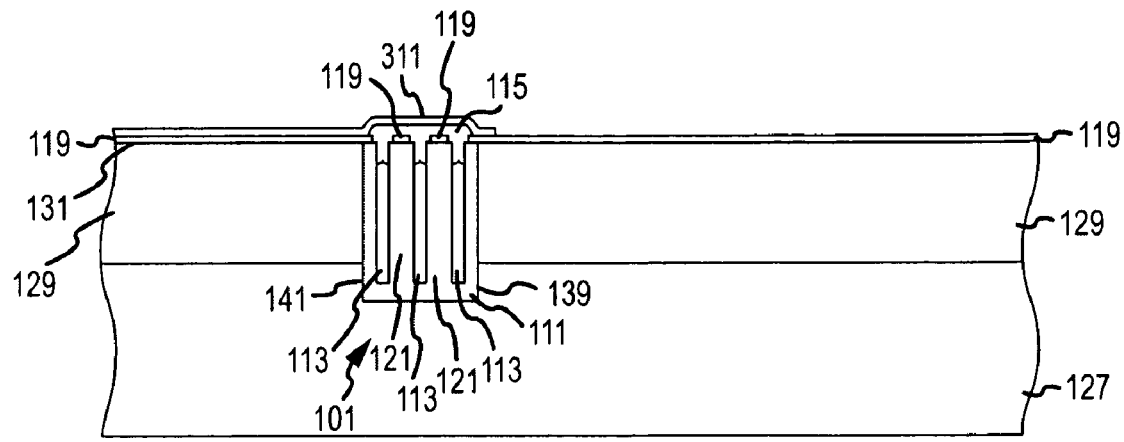
FIG. 12 is a cross-sectional view of the semiconductor structure of FIG. 11 at a later stage of manufacture.
Figure 13:
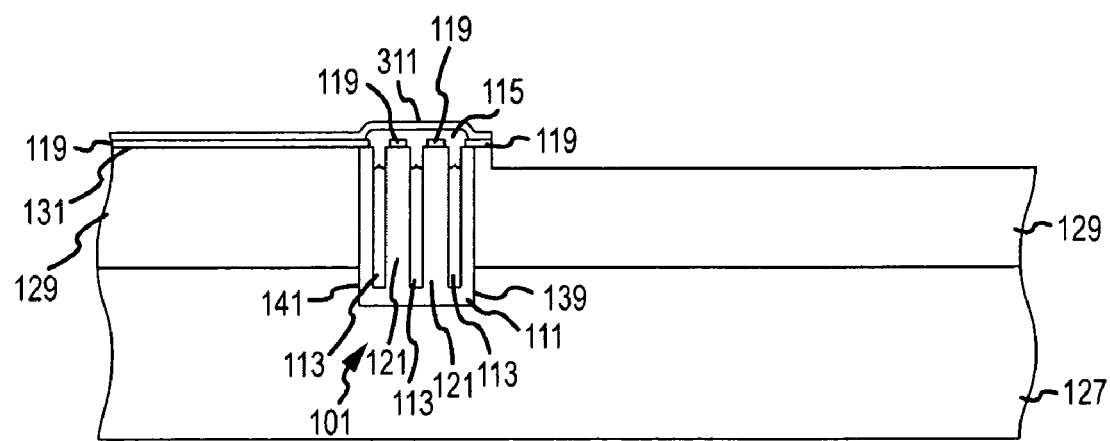
FIG. 13 is a cross-sectional view of the semiconductor structure of FIG. 12 at a later stage of manufacture.

Briefly referring to FIG. 12, photolithography and etching processes can be used to remove a portion of silicon nitride layer 311. Referring to FIG. 13, after the removal of the portion of layer 311, photolithography and etching processes can be used to remove an exposed portion of silicon dioxide 119, and then subsequently to remove an exposed portion of epitaxial layer 129. The removal of a portion of epitaxial layer 129 can be referred to as a recessed etch, and this etch can be either a wet etch or a dry etch. The wet etch can be performed with a solution of tetra-methyl ammonium hydroxide (TMAH) heated to about 90° C. In addition, other wet etch chemistries such as, for example, Hydrofluoric (HF) acid, nitric acid, acetic acid, or such combinations can be used. The recessed etch can also be done using a gaseous chemistry. The recessed area or opening created by the recessed etch may have a depth ranging from about 0.1 micron to about one micron as measured from surface 131 of epitaxial layer 129.

Figure 14:
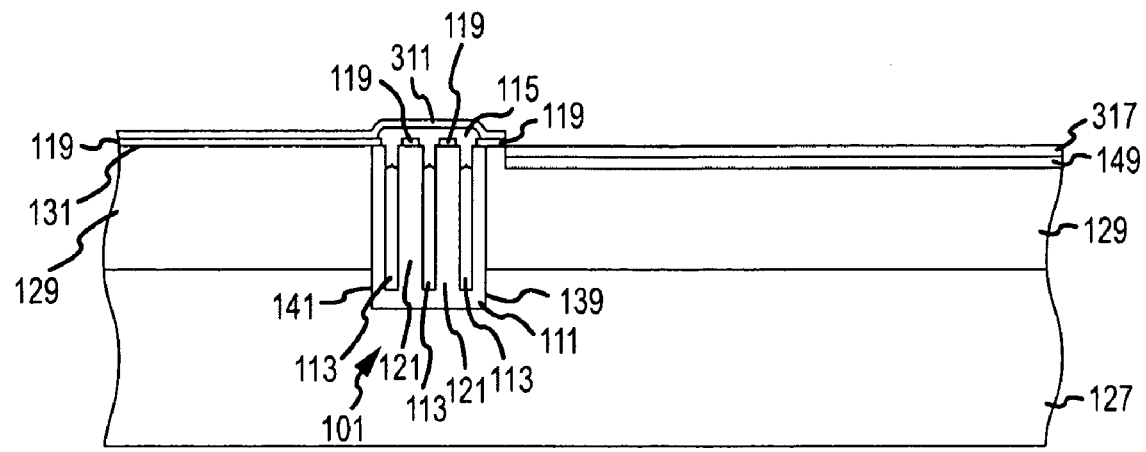
FIG. 14 is a cross-sectional view of the semiconductor structure of FIG. 13 at a later stage of manufacture.

Referring to FIG. 14, a region or layer of silicon-germanium-carbon (SiGeC) 149 may be formed using a selective epitaxial growth technique so that the SiGeC layer 149 will be formed in the recessed etch area along the exposed surface of silicon epitaxial layer 129. In one or more embodiments, the thickness of SiGeC layer 149 may range from about 0.5 microns to about four microns. SiGeC epitaxial layer 149 may be doped with an impurity material of n-type conductivity such as, for example, phosphorous or arsenic.

The SiGeC layer 149 increases the strain in the silicon and this will increase mobility. The addition of carbon provides dopant retardation. For example, carbon is added to retard the diffusion of boron which is used as the dopant in p-body region 157. The percentage of carbon can vary between about 0.1 to about 0.5 percentage by concentration. In some embodiments, techniques such as molecular beam epitaxy (MBE), liquid phase epitaxy, or ultra high vacuum CVD (UHVCVD) can be used for the growth of SiGeC layer 149.

After forming SiGeC layer 149, an epitaxial layer of silicon (Si) 317 may be formed using a selective epitaxial growth technique so that the silicon layer 317 will be formed in the recessed etch area along the exposed surface of SiGeC layer 149. In one or more embodiments, the thickness of silicon layer 317 may range from about 50 Å to about 1000 Å. Silicon layer 317 can be used to subsequently form a high quality oxide layer that may be used as gate oxide 153 (FIG. 1). The thickness of silicon layer 317 may be relatively thin so that all of, or a substantial portion of, silicon layer 317 can be consumed during a subsequent thermal oxidation process that may be used to convert the silicon of silicon layer 317 to silicon dioxide, and this silicon dioxide may be used as gate oxide 153. An optional Chemical Mechanical Planarization (CMP) process may be used to improve planarity of the upper portion of structure 100 after formation of semiconductor layers 149 and 317. Semiconductor layers 149 and 317 may also be referred to as semiconductor materials. In some embodiments, epitaxial layer 317 is devoid, or substantially devoid, of germanium and is devoid, or substantially devoid, of carbon.

Although layers 149 and 317 are discussed as being formed using selective epitaxial growth techniques, the methods and apparatuses described herein are not limited in this regard. In other embodiments, non-selective epitaxial growth techniques may be used to form semiconductor layers 149 and 317. In these embodiments, portions of layers 149 and 317 would also be formed outside of the recessed etch area and an etch or a CMP process may be used to remove the portions of layers 149 and 317 that are formed in undesirable locations of structure 100 outside of the recessed etch area.

SiGeC layer 317 retards diffusion of impurity materials such as, for example, boron. This may be advantageous for the operation of vertical FET 102 (FIG. 1). For example, as is described herein, doped region 157 (FIG. 1) may be p-type and may be formed by implanting boron into at least a portion of SiGeC layer 317. Channel region 159 (FIG. 1) is in doped region 157 (FIG. 1). Since SiGeC layer 317 retards diffusion of boron, this can result in better control of channel region 159 (FIG. 1) so that the doping profile of channel region 159 is substantially uniform and a relatively abrupt p-n junction is formed between the channel and drain regions. This can allow the formation of relatively shorter channel lengths in vertical FET 102 (FIG. 1). The substantially uniform doping profile implies that the concentration of the impurity material in channel region 159 is substantially constant along the channel region, from the source-channel junction to the drain-channel junction. In other words, doping concentration of the channel region from the source-channel junction to the drain-channel junction is substantially uniform.

Relatively abrupt junctions and a uniform doping profile in the channel region 159 of FET 102 (FIG. 1) can result in a relatively stable threshold voltage for FET 102, a relatively high early voltage for FET 102, and a relatively shorter channel length for FET 102. This can result in FET 102 having improved linearity and a relatively higher frequency of operation. In addition, SiGeC layer 149 has increased mobility compared to, for example, silicon epitaxial layer 129, and therefore, forming the source region 145 (FIG. 1), the channel region 159 (FIG. 1), at least a portion of the drain region 147, 149 (FIG. 1) of FET 102 (FIG. 1) in SiGeC layer 149 can result in a relatively higher operating frequency for FET 102.

Figure 15:
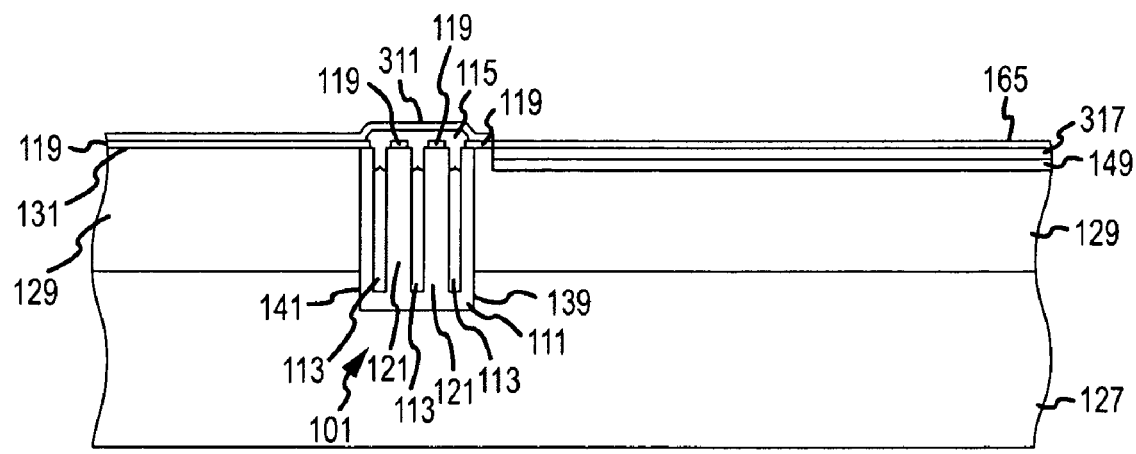
FIG. 15 is a cross-sectional view of the semiconductor structure of FIG. 14 at a later stage of manufacture.

Referring to FIG. 15, a layer of dielectric material 165 is formed on or over silicon epitaxial layer 317. Layer 165 may comprise, for example, silicon dioxide ($SiO_2$) and may have a thickness ranging from about 500 Å to about 1,000 Å. Dielectric layer 165 may be formed using thermal growth techniques such as, for example, thermal oxidation of silicon. For example, a thermal oxidation process may be performed to convert an exposed portion of epitaxial layer 317 to silicon dioxide, thereby forming a silicon dioxide layer 165. Only a portion of silicon epitaxial layer 317 is consumed during this thermal oxidation process, as a subsequent thermal oxidation will be performed during a later step discussed with reference to FIG. 27 to form gate oxide 153 by converting a remaining portion of silicon epitaxial layer 317 to a thermal oxide. As an example, after the thermal oxidation that is used to form silicon dioxide layer 165 is performed, about 10 Å to about 100 Å of silicon epitaxial layer 317 may remain below silicon dioxide layer 165, and a portion of this relatively thin layer of silicon epitaxial layer 317 may be used to form gate oxide 153 as is discussed below with reference to FIG. 27.

Figure 16:
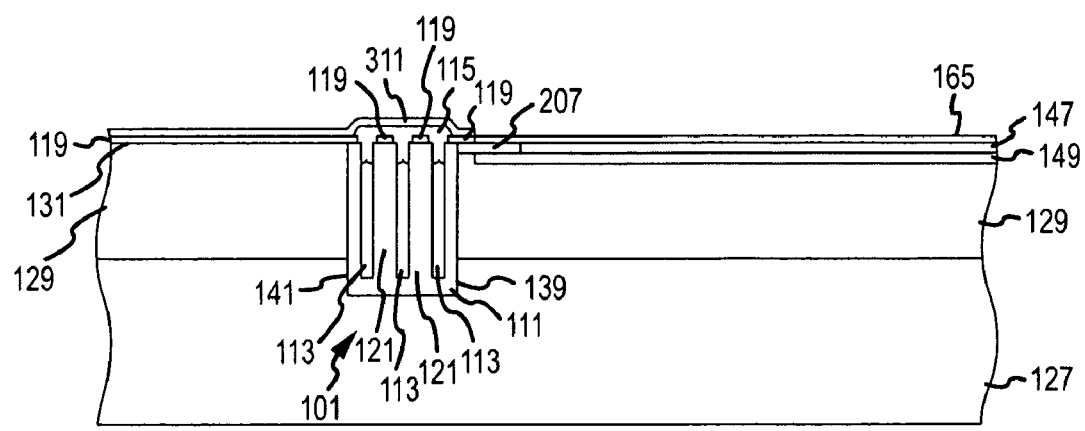
FIG. 16 is a cross-sectional view of the semiconductor structure of FIG. 15 at a later stage of manufacture.

Referring now to FIG. 16, two implant operations may be performed to form doped regions 207 and 147. For example, two photomasks (not shown) may be used to form doped regions 207 and 147. For example, an impurity material of p-type conductivity can be implanted through the opening of a first photomask (not shown) and through the exposed portions of silicon dioxide layer 165 and silicon nitride layer 311 to form a doped region 207 of p-type conductivity in portions of semiconductor layers 317 (FIG. 15), 149, and 129. A doped region can also be referred to as an implant region. The implant can include implanting the dopant at a dose ranging from about $10^{11}$ ions/cm$^2$ to about $10^{16}$ ions/cm$^2$ using an implant energy ranging from about 10 keV to about 200 keV. Suitable dopants of p-type conductivity include boron. The implant can be a zero degree implant. After the implant, the first photomask (not shown) can be removed. P-type doped region 207 can be a termination doped region formed abutting an upper portion of termination structure 101. P-type doped region 207 may serve as a termination doped region since during the operation of FET 102 (FIG. 1), current will not flow into p-type doped region 207. In embodiments where termination structure 101 has a ring shape, p-type doped region 207 may have a ring shape and may be referred to as a p-ring doped region.

After forming doped region 207, an impurity material of n-type conductivity can be implanted through the opening of a second photomask (not shown) and through the exposed portion of oxide layer 165 to form a doped region 147 of n-type conductivity in portions of semiconductor layers 317 (FIG. 15) and 149. The implant can include implanting a dopant of n-type conductivity such as, for example, phosphorus at a dose ranging from about $10^9$ ions/cm$^2$ to about $10^{13}$ ions/cm$^2$ using an implant energy ranging from about 10 keV to about 800 keV. In some embodiments, multiple implants can be performed to form doped region 147. In other words, doped region 147 is formed in silicon epitaxial layer 317 (FIG. 15) and in a portion of SiGeC layer 149. Other suitable n-type conductivity impurity materials include arsenic and antimony. The implant can be a zero degree implant. After this n-type implant, the photomask (not shown) used to form doped region 147 is removed. The n-type implant used to form n-type doped region 147 can be referred to as a blanket n-type implant. N-type doped region 147 can improve the current density for the drain region of FET 102 (FIG. 1) by increasing the doping concentration in the regions abutting the channel region 159 (FIG. 1) of FET 102. In FIGS. 16 to 34 and in FIG. 1, silicon epitaxial layer 317 (FIG. 15) is no longer shown as doped regions 207 and 147 are shown. However, as may be appreciated, doped regions 207 and 147 are formed in portions of silicon epitaxial layer 317 (FIG. 15). In other words, doped regions 207 and 147 comprise portions of silicon epitaxial layer 317 (FIG. 15).

Figure 17:
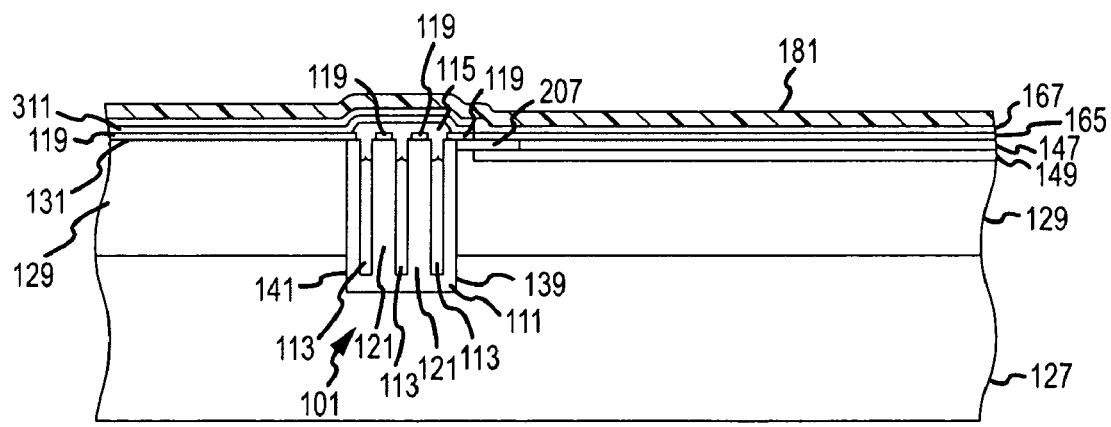
FIG. 17 is a cross-sectional view of the semiconductor structure of FIG. 16 at a later stage of manufacture.

Referring to FIG. 17, a layer of dielectric material 167 may be formed on layers 311 and 165. Layer 167 may comprise, for example, silicon nitride ($Si_3N_4$) and may have a thickness ranging from about 500 Å to about 1,000 Å. Dielectric layer 167 may be a conformal material and may be formed using low pressure chemical vapor deposition (LPCVD), although other methods of deposition for layer 167 may be used in other embodiments.

A layer of semiconductor material 181 may be formed on dielectric layer 167. Layer 181 may comprise polycrystalline silicon or polysilicon, and may have a thickness ranging from about 500 Å to about 1,000 Å. In one embodiment, polysilicon layer 181 can be deposited using a chemical vapor deposition (CVD) process such as, for example, LPCVD. An impurity material of n-type conductivity or p-type conductivity can be implanted into polysilicon layer 181 to increase its conductivity. N-type conductivity impurity materials can include phosphorus, arsenic, and antimony, and p-type conductivity impurity materials can include boron and indium. In some embodiments, the implant for polysilicon layer 181 can include implanting a dopant of n-type conductivity such as, for example, arsenic at a dose ranging from about $10^{13}$ ions/cm$^2$ to about $10^{16}$ ions/cm$^2$ using an implant energy ranging from about 10 keV to about 200 keV. The implant can be a zero degree implant or a tilt angle implant. In some embodiments, polysilicon layer 181 can be doped before or after being deposited, and in other embodiments, polysilicon layer 181 can be doped in-situ or during its deposition. Layer 181 can also be referred to as a conductive layer.

Figure 18:
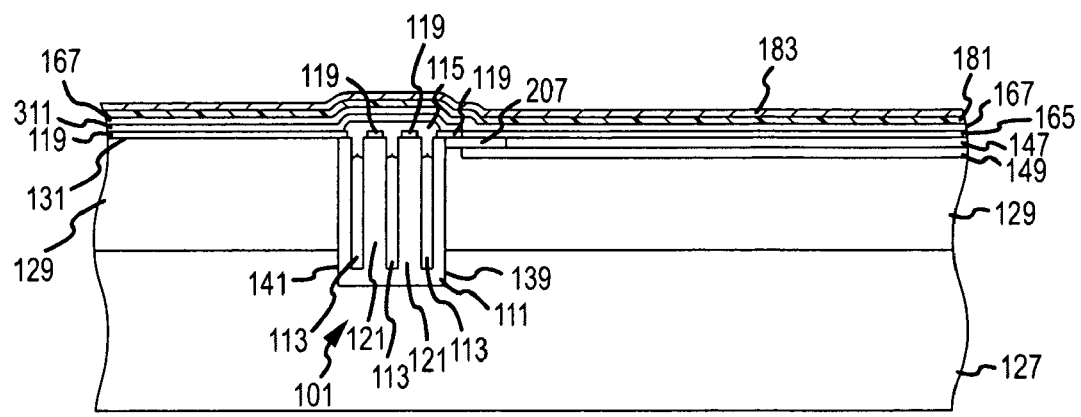
FIG. 18 is a cross-sectional view of the semiconductor structure of FIG. 17 at an earlier stage of manufacture.

Referring to FIG. 18, all or a portion of layer 181 may be converted to a conductive silicide 183 to form a conductive layer 183 having an electrical resistance that is less than the resistance of conductive layer 181. Silicide layer 183 may be formed by forming a metal layer (not shown) on layer 181 and then performing an anneal operation to form a conductive silicide. The metal layer may be may be formed using deposition processes such as evaporation, sputtering, chemical vapor deposition (CVD), plating or electroplating. In one example the metal layer may comprise tungsten and may have a thickness in the range of about 500 Å to about 1,000 Å. After the metal layer (not shown) is deposited, it may be annealed to form conductive silicide layer 183. The annealing ambient may comprise, for example, nitrogen, argon, hydrogen or combinations thereof. As is discussed above, layers 181 and 183 may be used as electrically conductive shield layers in active device 102 (FIG. 1).

Figure 19:
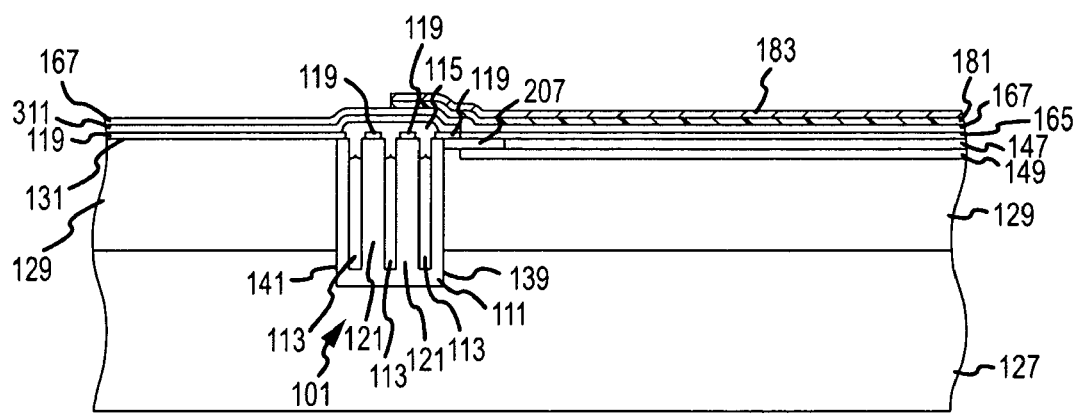
FIG. 19 is a cross-sectional view of the semiconductor structure of FIG. 18 at a later stage of manufacture.

Referring now to FIG. 19, a photomask (not shown) may be used to pattern layers 181 and 183 so as to remove portions of layer 181 and 183 where these layers are not desired. In particular, portions of layers 181 and 183 unprotected by the photomask (not shown) can be anisotropically etched using, for example, an anisotropic reactive ion etching (RIE) technique. The etch may stop on or in dielectric layer 167 to expose a portion of dielectric layer 167.

Figure 20:
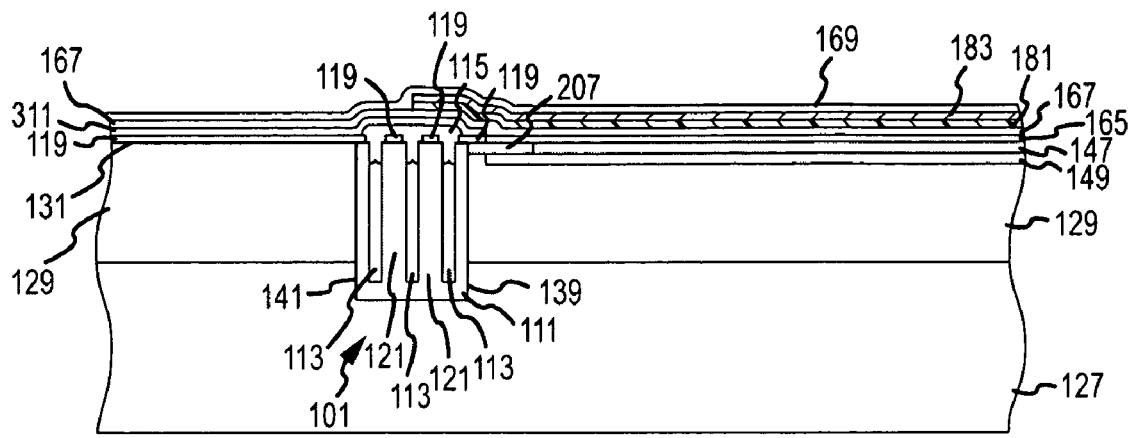
FIG. 20 is a cross-sectional view of the semiconductor structure of FIG. 19 at a later stage of manufacture.

Referring to FIG. 20, a layer of dielectric material 169 may be formed on silicide layer 183 and on the exposed portion of dielectric layer 167. Layer 169 may comprise, for example, silicon nitride ($Si_3N_4$) and may have a thickness ranging from about 500 Å to about 1,500 Å. Dielectric layer 169 may be a conformal material and may be formed using low pressure chemical vapor deposition (LPCVD).

Figure 21:
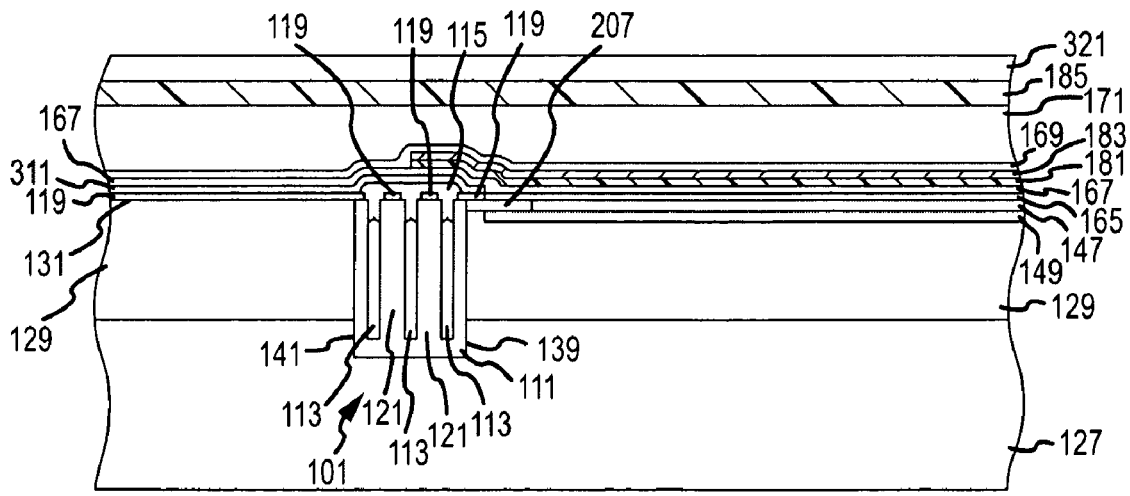
FIG. 21 is a cross-sectional view of the semiconductor structure of FIG. 20 at a later stage of manufacture.

Referring to FIG. 21, a layer of dielectric material 171 having a thickness ranging from about 0.1 μm to about one μm can be formed on dielectric layer 169. By way of example, dielectric layer 171 comprises an oxide that is formed by decomposition of tetraethylorthosilicate (TEOS), and accordingly the dielectric layer may be referred to as a TEOS oxide in this example. TEOS oxide layer 171 may be formed using LPCVD. Dielectric layer 171 may be made sufficiently thick to reduce parasitic capacitance between gate interconnect layer 185 and shield layers 183 and 181.

A conductive layer 185 such as, for example, doped polysilicon, can be formed on dielectric layer 171. Doped polysilicon layer 185 can be formed using LPCVD and may have a thickness ranging from about 500 Å to about 0.5 μm. Further, doped polysilicon layer 185 can be doped prior to, during, or after deposition of the polysilicon.

A layer of dielectric material 321 may be formed on conductive layer 185. Layer 321 may comprise, for example, silicon nitride ($Si_3N_4$) and may have a thickness ranging from about 500 Å to about 2,000 Å. Dielectric layer 321 may be formed using low pressure chemical vapor deposition (LPCVD).

Figure 22:
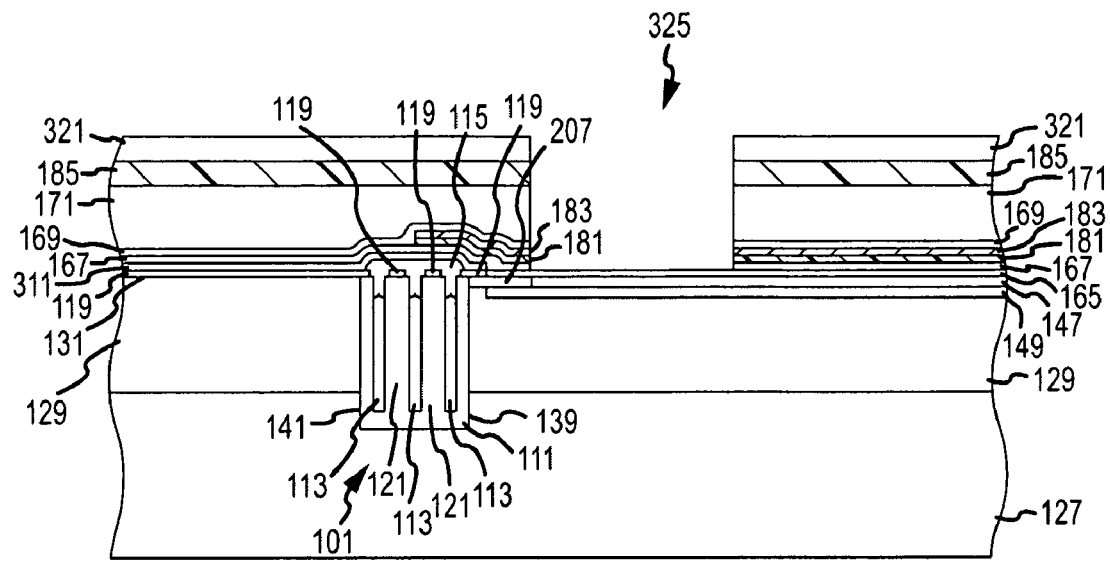
FIG. 22 is a cross-sectional view of the semiconductor structure of FIG. 21 at a later stage of manufacture.

Referring to FIG. 22, a photomask (not shown) may be formed over structure 100 and a series of anisotropic etches may be used to form an opening 325 to expose a portion of layer 165 by removing portions of layers 321, 185, 171, 169, 183, 181, and 167. In one or more embodiments, opening 325 may have a width ranging from about one μm to about 10 μm.

Figure 23:
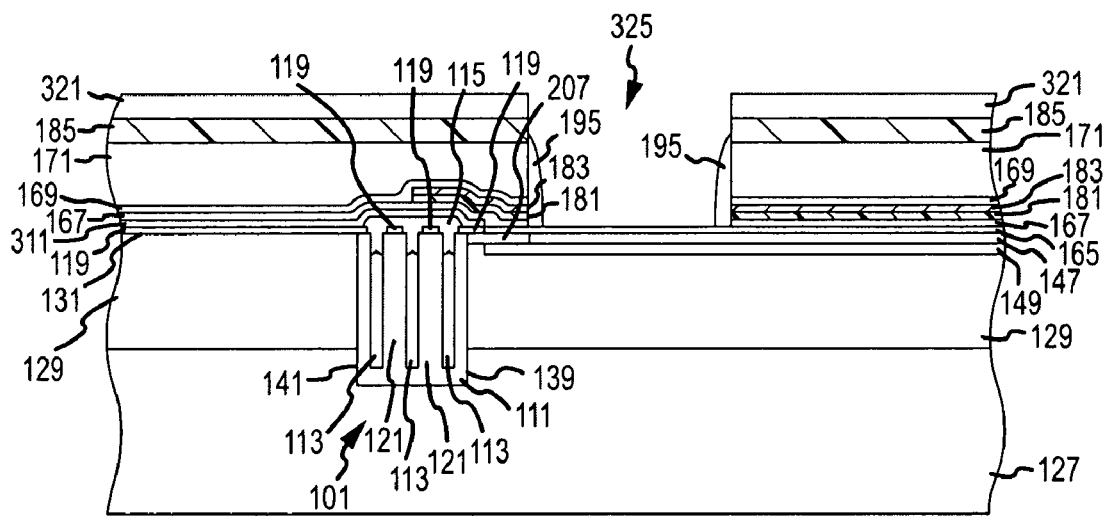
FIG. 23 is a cross-sectional view of the semiconductor structure of FIG. 22 at a later stage of manufacture.

Referring to FIG. 23, a conformal layer of dielectric material 195 such as, for example, silicon nitride, can be formed over the structure 100 shown in FIG. 22, and then this layer can be patterned to form one or more dielectric spacers 195.

In some embodiments, dielectric layer 195 can be formed using LPCVD and can have a thickness ranging from about 500 Å to about 2,000 Å.

In some embodiments, two etches are used to form dielectric spacers 195. The initial etch may be an anisotropic etch that may remove portions of dielectric material 195 from the horizontal surfaces of structure 100. Then, a relatively short, subsequent isotropic etch may be used to further remove portions of dielectric material 195 to expose a portion of conductive layer 185. Dielectric spacers 195 may be used to electrically isolate gate 155 (FIG. 1) from shield layers 183 and 181.

Figure 24:
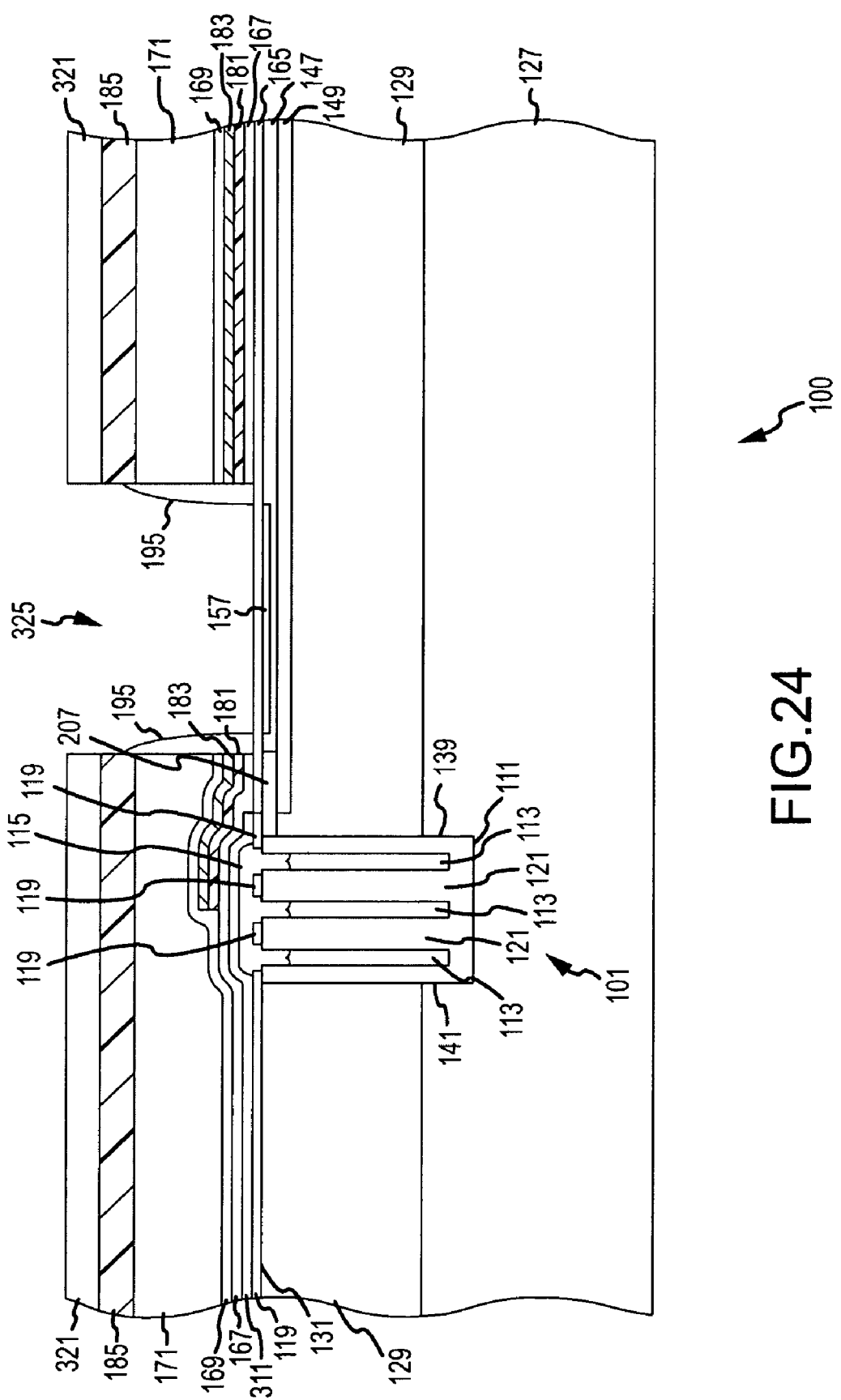
FIG. 24 is a cross-sectional view of the semiconductor structure of FIG. 23 at a later stage of manufacture.

Turning to FIG. 24, after the formation of dielectric spacers 195, an impurity material of p-type conductivity can be implanted through opening 325 to form a doped region 157, which is self-aligned with dielectric spacers 195. The impurity material to form doped region 157 is implanted into a portion of n-type doped region 147, and a majority of doped region 147 is formed in SiGeC layer 149. The implant is referred to as a p-body implant, and p-type doped region 157 may be referred to as a p-body region. As is discussed above, channel region 159 (FIG. 1) of FET 102 (FIG. 1) is located in a portion of p-type doped region 157. The implant to form doped region 157 can include implanting a dopant of p-type conductivity such as, for example, boron at a dose ranging from about $10^{12}$ ions/cm$^2$ to about $10^{15}$ ions/cm$^2$ using an implant energy ranging from about 10 keV to about 400 keV, and in some embodiments, multiple implants may be used to form doped region 157. Although not shown, a threshold voltage adjust implant may be performed to adjust the threshold voltage of FET 102 by, for example, implanting boron with a dose ranging from about $10^{12}$ ions/cm$^2$ to about $10^{15}$ ions/cm$^2$ using an implant energy ranging from about 10 keV to about 100 keV.

As is discussed above, SiGeC layer 149 and doped region 147 which is formed in SiGeC layer 149, retards the diffusion of boron compared to a silicon epitaxial layer. Therefore, forming p-body region 157 in a SiGeC material will allow for better control during formation of the channel region 159 (FIG. 1) of FET 102 (FIG. 1) since the diffusion of the boron is controlled using the SiGeC material. In other words, the presence of germanium and carbon in doped region 147 controls or limits the diffusion of boron in doped region 147, and this can result in forming doped region 157 to have a substantially uniform doping profile after annealing and driving in doped region 157.

Figure 25:
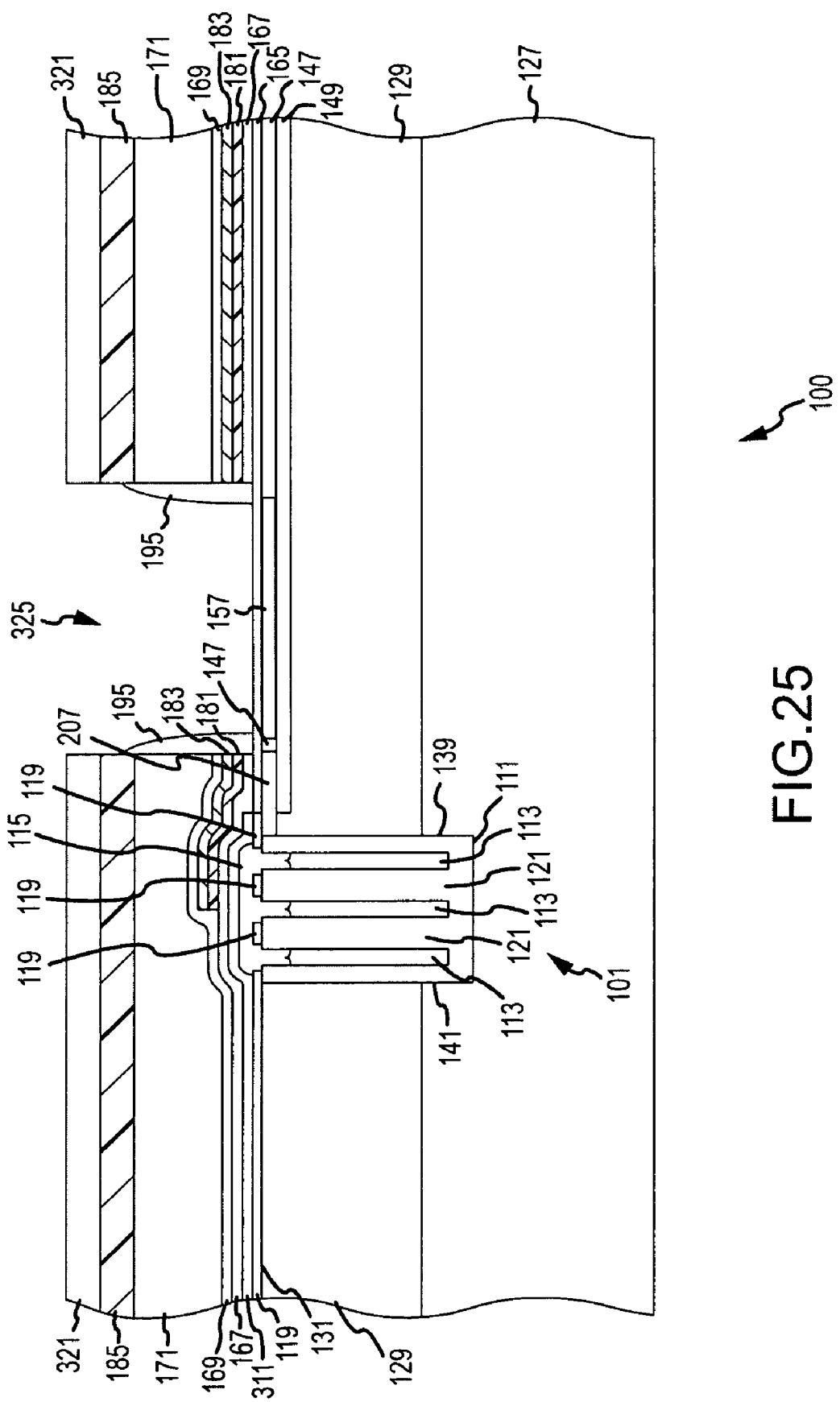
FIG. 25 is a cross-sectional view of the semiconductor structure of FIG. 24 at a later stage of manufacture.

Referring to FIG. 25, an anneal can be performed which includes heating structure 100 to a temperature ranging from about 900° C. to about 950° C. for a time period of about one hour to about four hours in a nitrogen ambient. Heating structure 100 in this way drives the impurity material of doped region 157 deeper into doped region 147 so that the depths and widths of doped region 157 increases. Again, the presence of germanium and carbon in doped region 147 controls the diffusion of boron doped region 157 in doped region 147.

Figure 26:
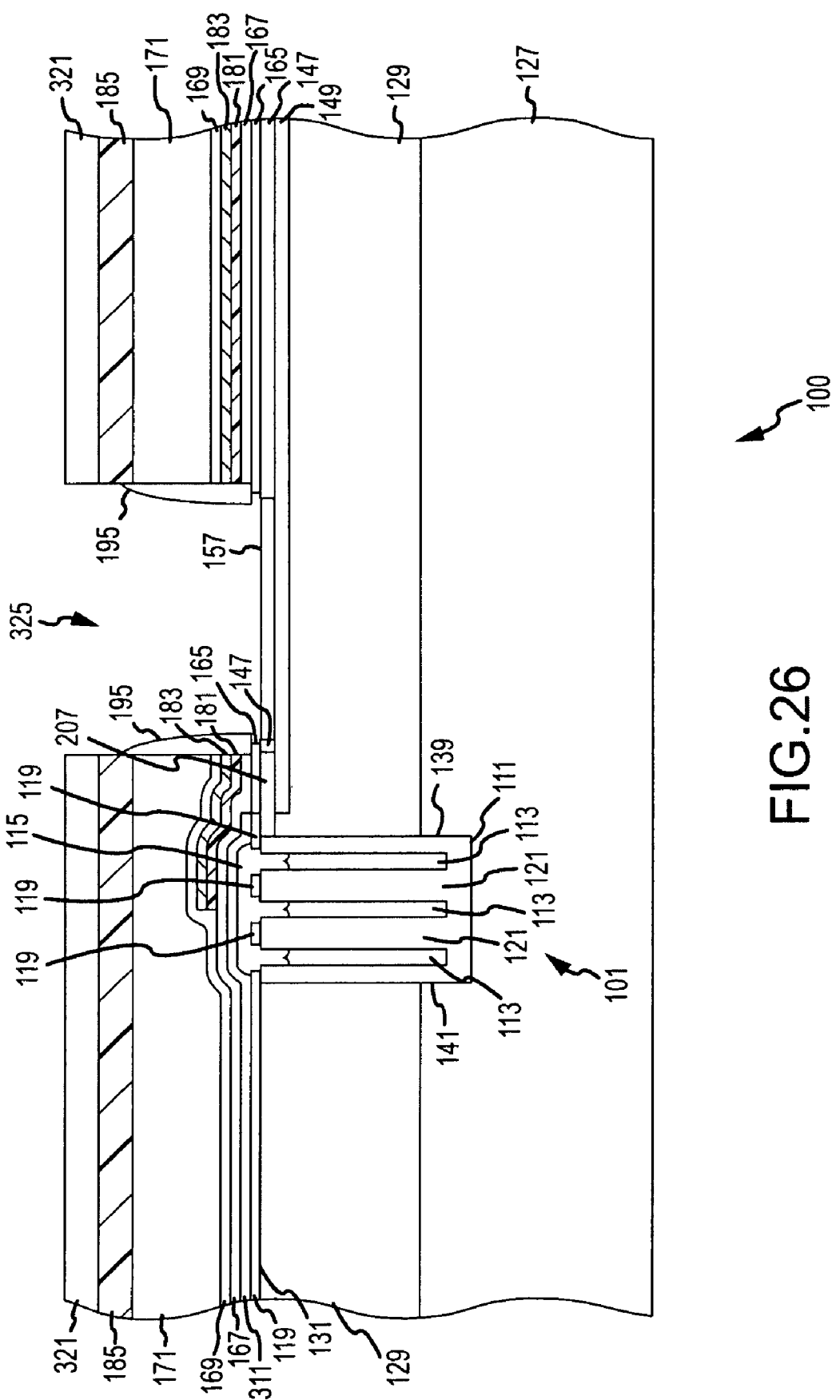
FIG. 26 is a cross-sectional view of the semiconductor structure of FIG. 25 at a later stage of manufacture.

Turning to FIG. 26, an exposed portion of silicon dioxide layer 165 may be removed by, for example, use of a wet etching process using hydrofluoric acid or a similar product. This etch can undercut a portion of silicon dioxide layer 165 that is under a portion of dielectric spacer 195. In other words, the wet etch can remove a portion of dielectric layer 165 that is under a portion of dielectric spacer 195. The undercut will allow a portion of gate 155 (FIG. 1) of FET 102 (FIG. 1) to be formed extending laterally beyond the p-body region 157 and over drain region 147. Forming gate 155 to extend laterally beyond the p-body region 157, and slightly over drain region 147, can ensure that FET 102 operates properly. Conversely, if gate 155 (FIG. 1) is formed "too short" or not over all of channel region 159 (FIG. 1) of FET 102 (FIG. 1), then FET 102 may not operate properly as there may be issues turning on FET 102 if gate 155 is not over all of channel region 159.

Figure 27:
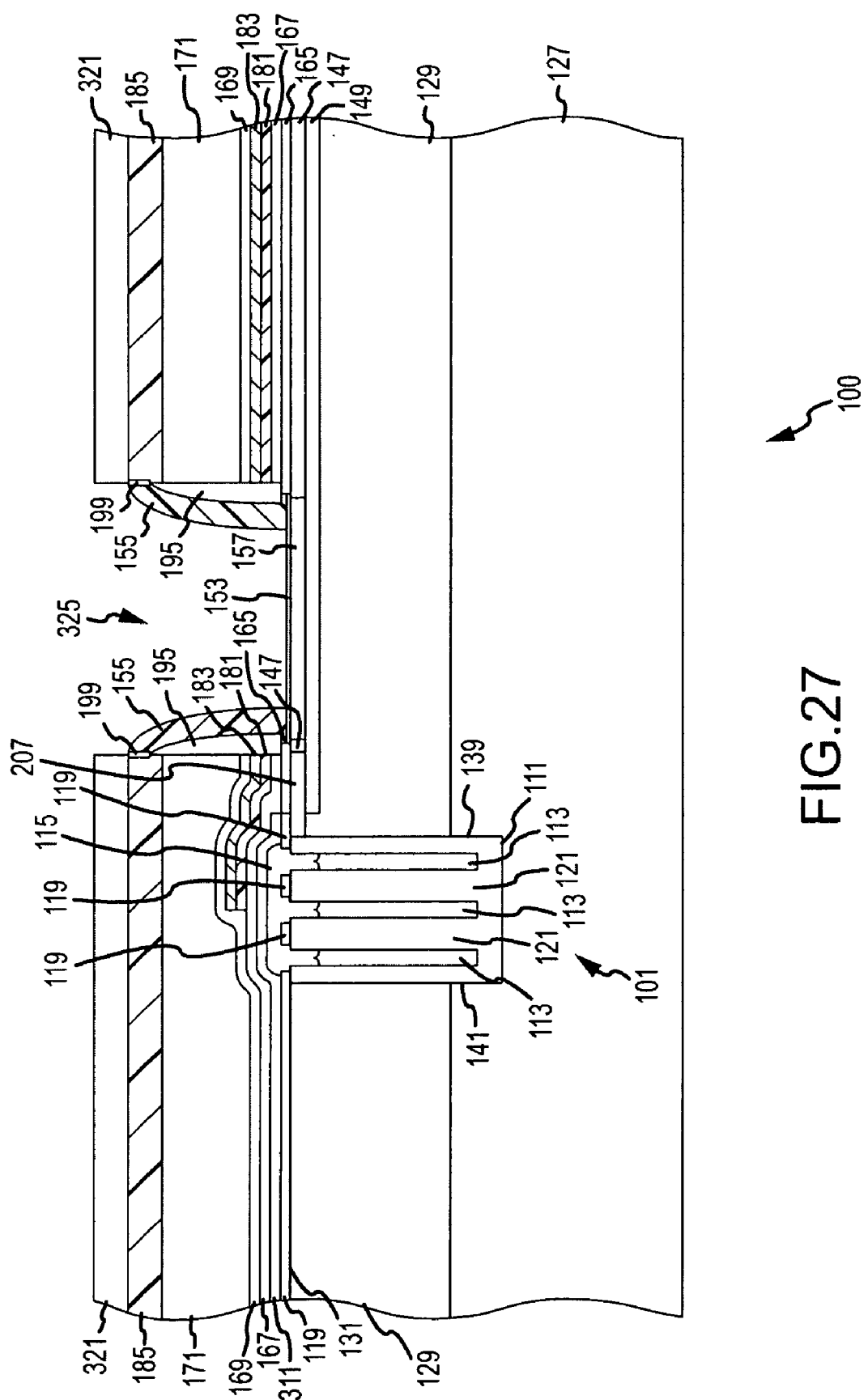
FIG. 27 is a cross-sectional view of the semiconductor structure of FIG. 26 at an earlier stage of manufacture.

Referring to FIG. 27, dielectric layer 153 can be formed over the exposed surface of doped region 157. In addition, dielectric layer 199 may be formed over the exposed portions of the sidewall of doped polysilicon gate interconnect layer 185. In some embodiments, dielectric layers 153 and 199 can comprise oxide, and may be grown simultaneously using a thermal oxidation process. In other embodiments, dielectric layers 153 and 199 may be formed using a deposition process, and in these embodiments, dielectric layers 153 and 199 may comprise hafnium oxide. As is discussed herein, a portion of oxide layer 153 that is under gate 155 may serve as the gate oxide for FET 102 (FIG. 1).

A conductive layer such as, for example, doped polysilicon, having a thickness ranging from about 500 Å to about 0.5 μm can be conformally formed over structure 100 after the formation of dielectric layers 153 and 199, and then this conductive layer can be patterned to form one or more conductive spacers 155. In some embodiments, the conductive layer used to form conductive polysilicon spacers 155 can be deposited using a chemical vapor deposition (CVD) process. An impurity material of n-type conductivity can be implanted into the conductive polysilicon layer. The implant can include implanting a dopant of n-type conductivity such as, for example, arsenic at a dose ranging from about $10^{14}$ ions/cm$^2$ to about $10^{16}$ ions/cm$^2$ using an implant energy ranging from about 10 keV to about 200 keV. The implant can be a zero degree implant or a tilt angle implant. Polysilicon spacers 155 can be doped in-situ or during its deposition.

Figure 32:
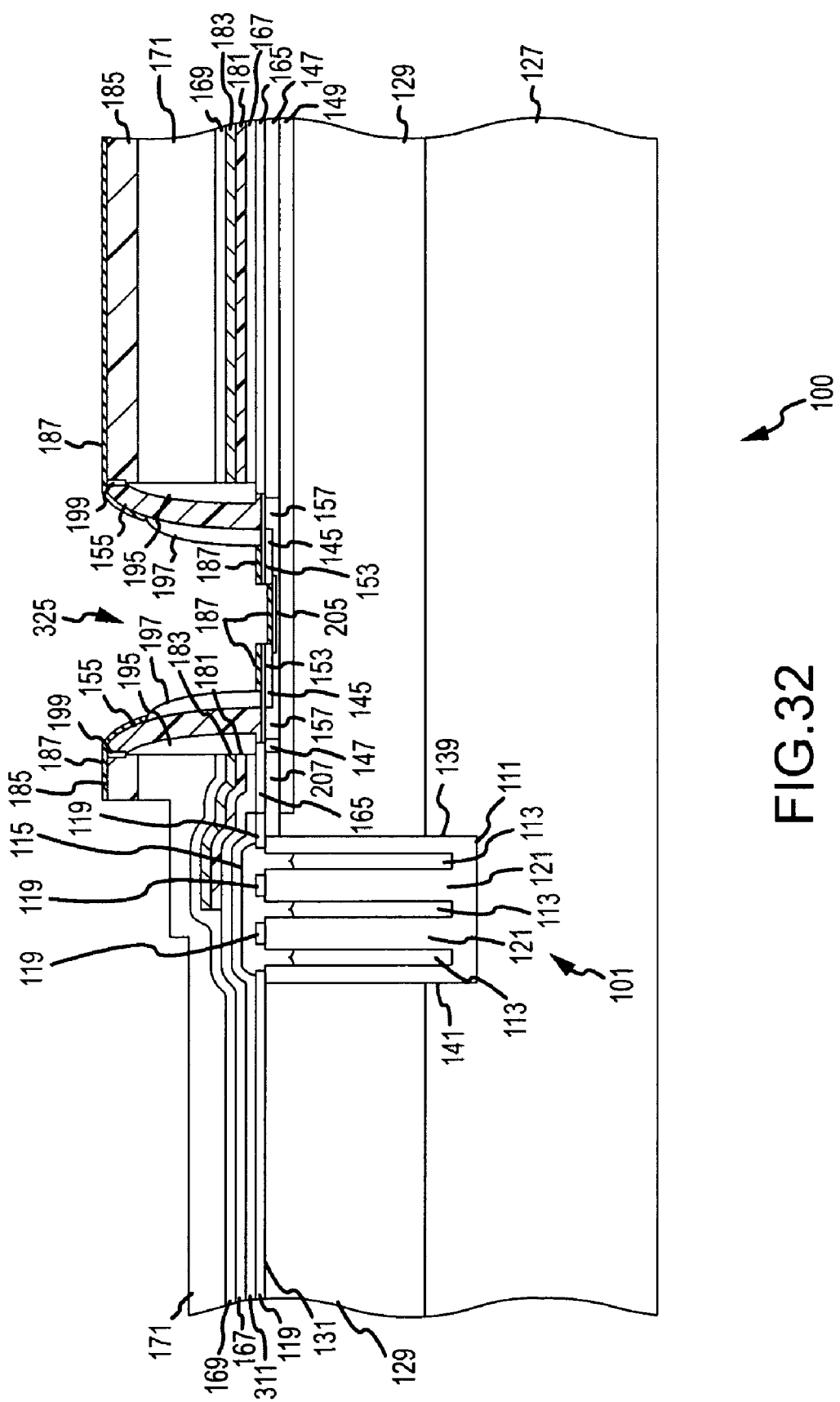
FIG. 32 is a cross-sectional view of the semiconductor structure of FIG. 31 at a later stage of manufacture.

The conductive polysilicon layer can be anisotropically etched to form a spacer gate 155. Spacer gate 155 is formed on a portion of dielectric layer 199, on a portion of dielectric spacer 195, and on a portion of dielectric layer 153. As discussed herein gate 155 can serve as the gate of FET 102 (FIG. 1). Dielectric layer 199 electrically isolates gate interconnect 185 from gate 155. As will be discussed below with reference to FIG. 32, gate interconnect 185 will be electrically coupled to gate 155 using conductive layer 187 (FIG. 32). Gate 155 is located laterally adjacent to shield layers 181 and 183, which can serve as a gate shield for FET 102 (FIG. 1). Shield layers 181 and 183 may reduce parasitic capacitive coupling between gate 155 and the drain regions of FET 102 (FIG. 1) since at least a portion of shield layers 181 and 183 are between at least a portion of gate 155 and at least a portion of the drain regions 147, 149, 129, and 127.

Forming gate 155 in this manner will result in the channel length of vertical FET 102 (FIG. 1) being set by the deposition thickness of gate 155 rather than the lithographic limitations of the semiconductor lithography tools. In other words, the channel length of the vertical FET 102 is a function of the gate length of gate 155 of FET 102 which is substantially equal to the deposition thickness of the material used to form gate 155 of FET 102 and is not dependent on lithographic dimensions.

Figure 28:
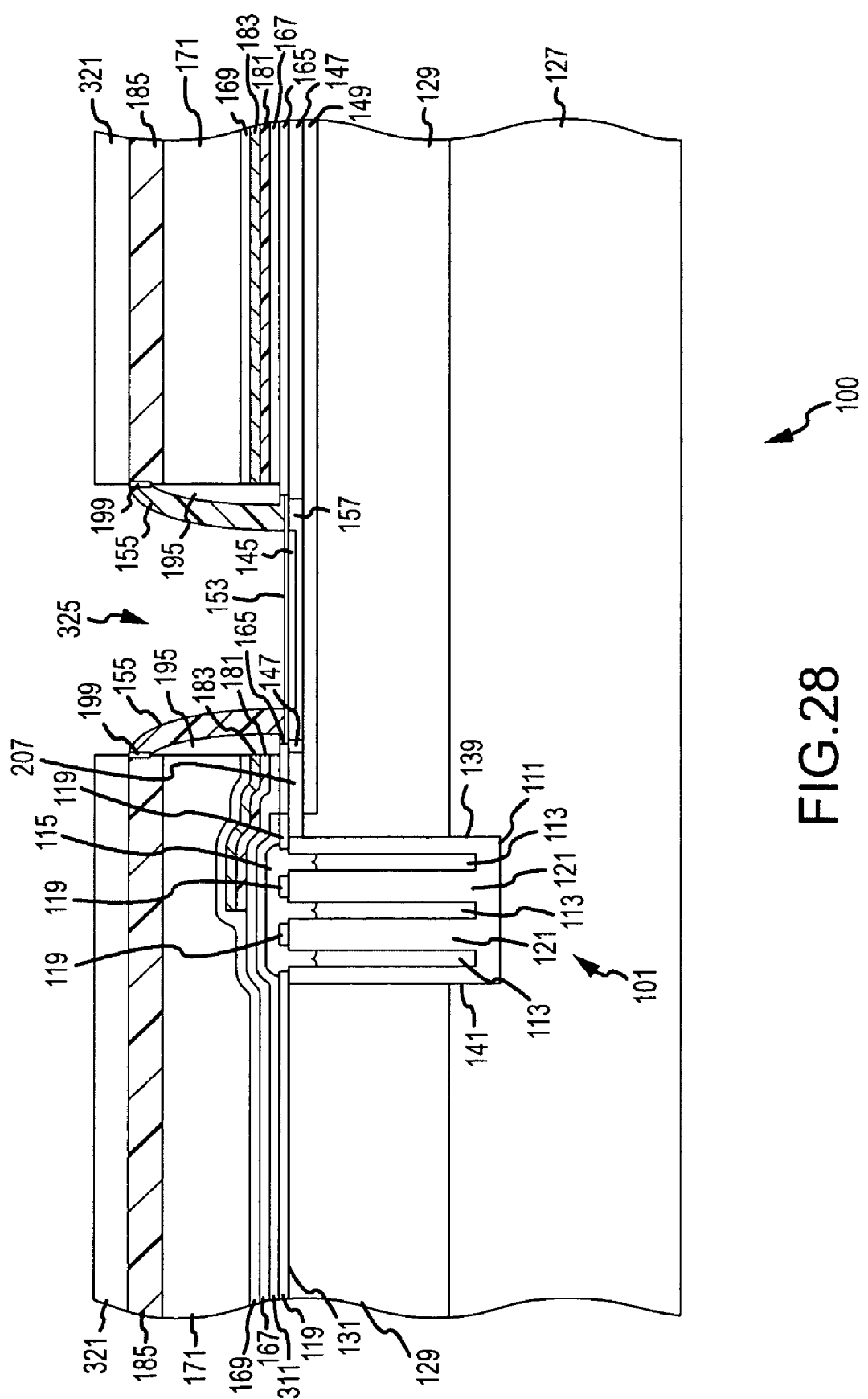
FIG. 28 is a cross-sectional view of the semiconductor structure of FIG. 27 at a later stage of manufacture.

Referring to FIG. 28, an impurity material of n-type conductivity can be implanted through opening 365 and through the exposed portion of oxide layer 153 to form a doped region 145 of n-type conductivity in a portion of doped region 157, wherein doped region 145 may be self-aligned with gate 155. This implant can include implanting a dopant of n-type conductivity such as, for example, phosphorus at a dose ranging from about $10^{13}$ ions/cm$^2$ to about $10^{15}$ ions/cm$^2$ using an implant energy ranging from about 10 keV to about 100 keV. Portions of doped region 145 can serve as the source region for FET 102 (FIG. 1).

Figure 29:
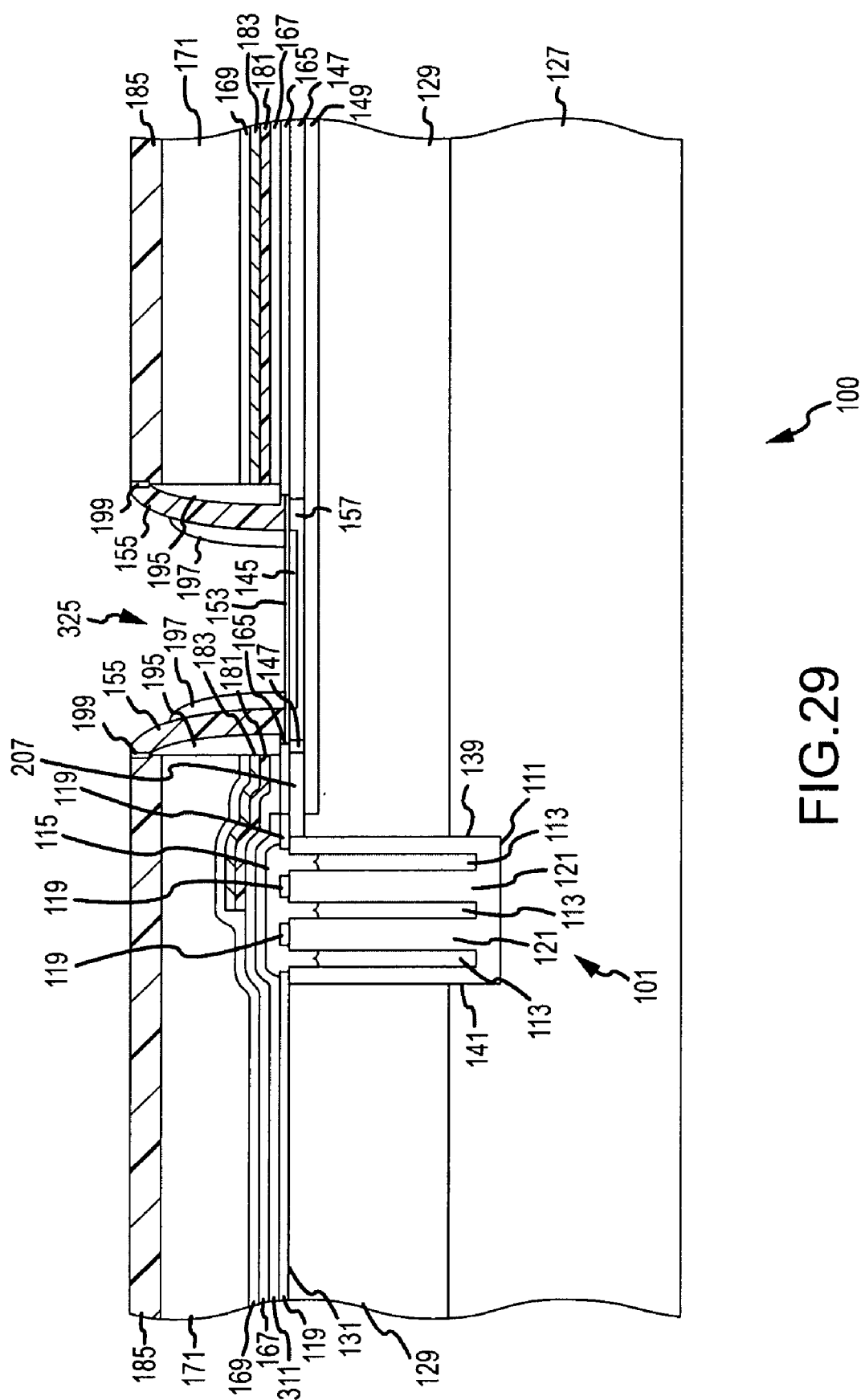
FIG. 29 is a cross-sectional view of the semiconductor structure of FIG. 28 at a later stage of manufacture.

Turning to FIG. 29, a layer of dielectric material having a thickness ranging from about 300 Å to about 1,000 Å can be formed over structure 100 and this layer of dielectric material can be patterned to form dielectric spacers 197. By way of example, the dielectric layer comprises an oxide that is formed by decomposition of tetraethylorthosilicate (TEOS), and accordingly the dielectric layer may be referred to as a TEOS oxide in this example. The dielectric layer can be anisotropically etched to form one or more dielectric sidewall spacers 197 on portions of doped polysilicon gate 155 and oxide layer 153. After the formation of dielectric spacers 197, silicon nitride layer 321 (FIG. 28) can be removed using, for example, a hot phosphoric etch process.

Figure 30:
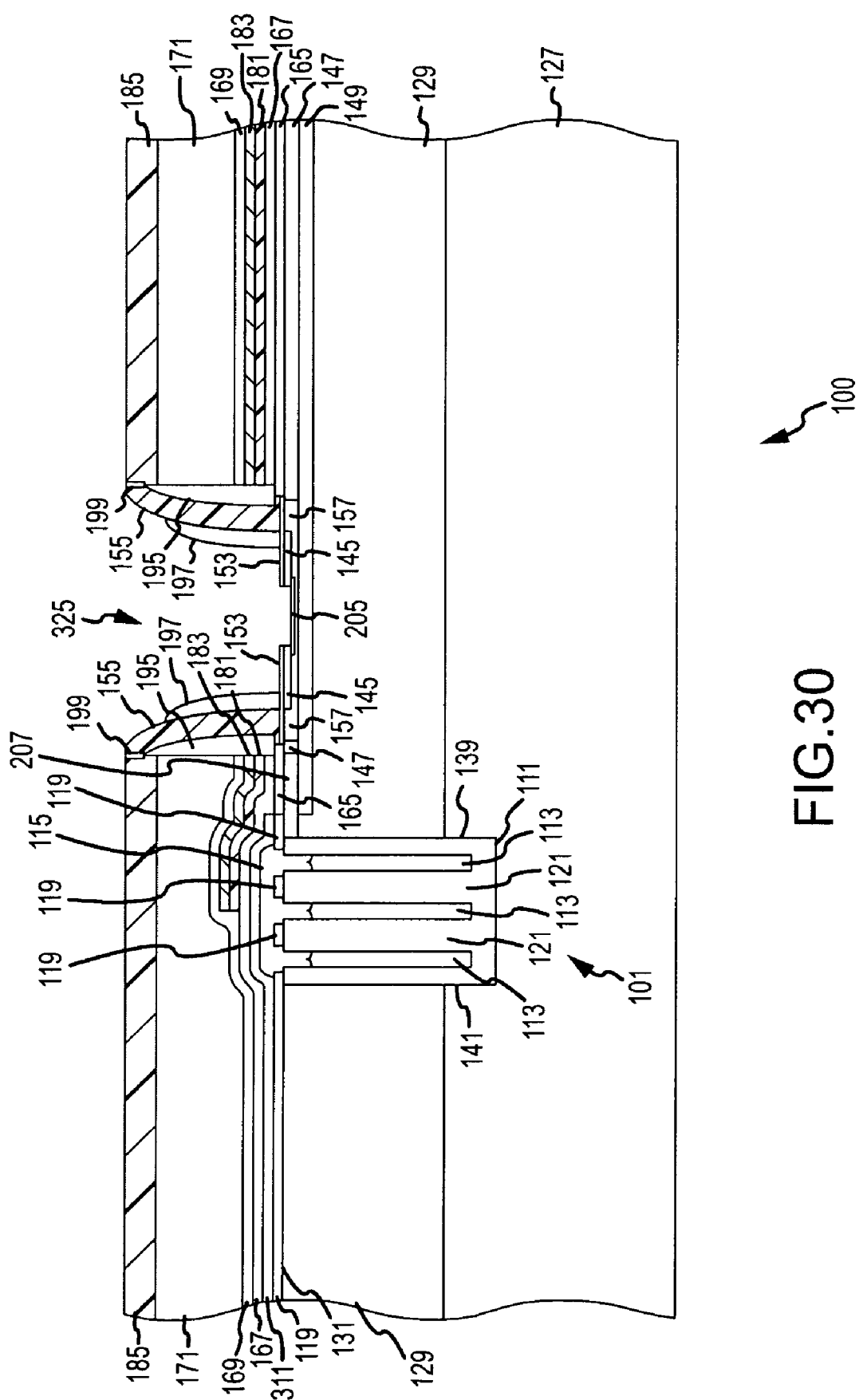
FIG. 30 is a cross-sectional view of the semiconductor structure of FIG. 29 at a later stage of manufacture.

Referring to FIG. 30, portions of oxide layer 153 and doped region 145 can be removed using photolithography and etching processes to expose a portion of doped region 157. In other words, portions of oxide layer 153 and doped region 145 can be removed using a photomask (not shown) and one or more etch operations.

For example, the portion of oxide layer 153 exposed by the photomask (not shown) can be etched with an etch chemistry that preferentially etches oxide. After etching through oxide layer 153 and exposing a portion of doped region 145, the etch chemistry can be changed to one that preferentially etches silicon and/or SiGeC and this etch will continue through doped region 145 to expose doped region 157.

An impurity material of p-type conductivity can be implanted into the exposed portion of doped region 157 to form a doped region 205 of p-type conductivity in a portion of doped region 157. This implant can include implanting a dopant of p-type conductivity such as, for example, boron at a dose ranging from about $10^{13}$ ions/cm$^2$ to about $10^{15}$ ions/cm$^2$ using an implant energy ranging from about 10 keV to about 150 keV.

Doped region 205 may be referred to as a p-type body contact or contact region 205, and can provide a lower contact resistance to p-body region 157. The doping concentration of p-type doped region 205 is relatively greater than the doping concentration of p-type doped region 157. In other words, doped region 205 is more heavily doped than doped region 157. Thus, contact region 205 can lower the sheet resistance of p-body region 157 under source region 145, which can suppress parasitic bipolar effects of an NPN device that may be formed by n-type doped region 145, p-type doped region 157, and n-type layer 149. The parasitic bipolar effects can be suppressed by electrically shorting n-type source region 145 and p-type contact region 205 using source contact 161 (FIG. 1) which is electrically coupled to both source region 145 and contact region 205.

Although not shown, after forming doped region 205, a second source implant can be performed with a heavily doped implant. For example, the second source implant can include implanting a dopant such as, phosphorous, at a dose ranging from about $10^{14}$ ions/cm$^2$ to about $10^{16}$ ions/cm$^2$ using an implant energy ranging from about 10 keV to about 60 keV.

Figure 31:
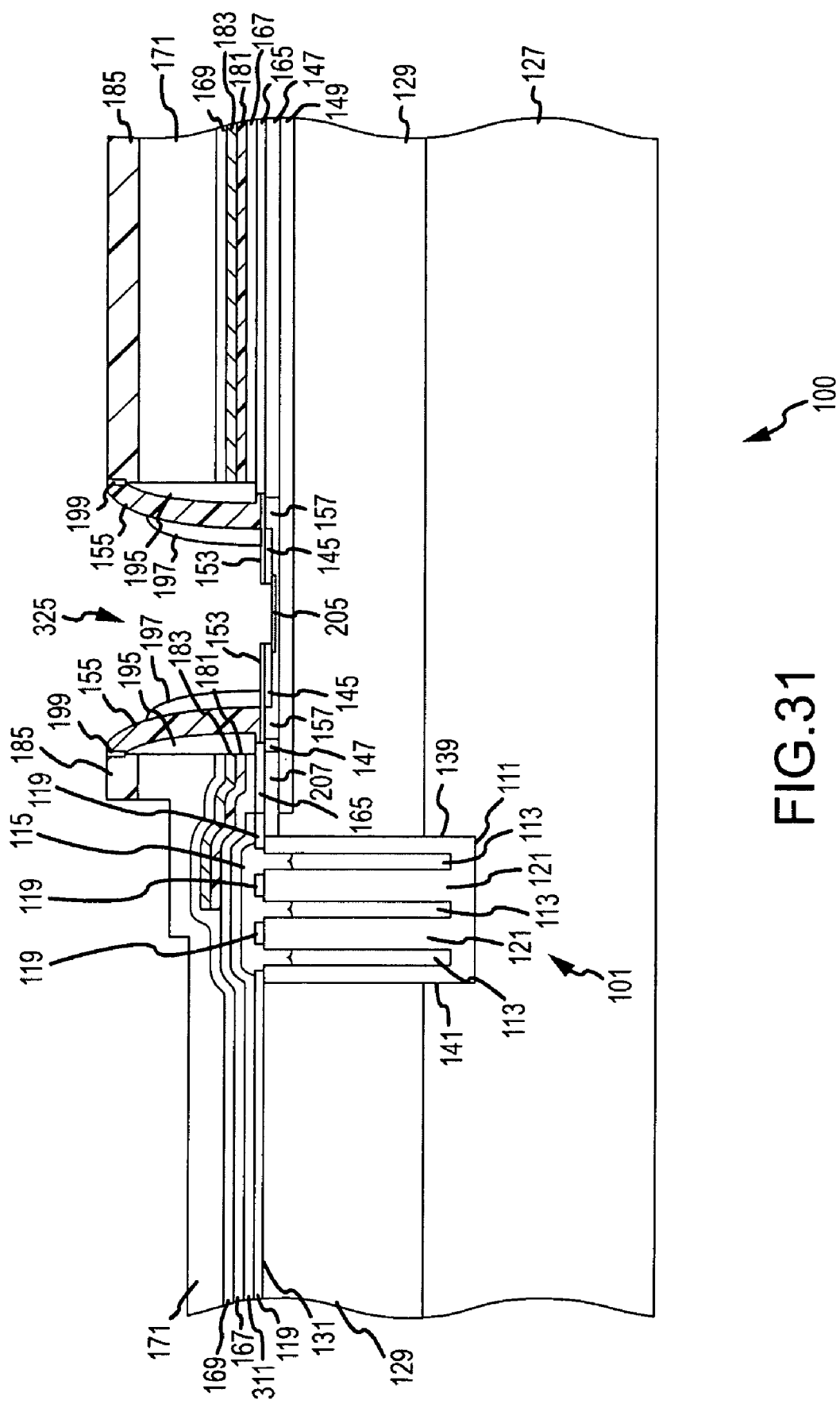
FIG. 31 is a cross-sectional view of the semiconductor structure of FIG. 30 at a later stage of manufacture.

Referring to FIG. 31, portions of doped polysilicon layer 185 and TEOS oxide layer 171 can be removed using photolithography and etching processes. In other words, portions of doped polysilicon layer 185 and TEOS oxide layer 171 can be removed using a photomask (not shown) and two etch operations. For example, doped polysilicon layer 185 may be etched using a reactive ion etch (RIE) and TEOS oxide layer 171 may be etched using a reactive ion etch (RIE). The etching of doped polysilicon layer 185 and TEOS oxide layer 171 are part of the process to expose shield layer 183 so that shield layer 183 can be connected to shield contact 193 (FIG. 1).

Referring to FIG. 32, a silicide layer 187 may be formed by forming a metal layer (not shown) on structure 100 and then performing an anneal operation to form a conductive silicide. The metal layer may be may be formed using deposition processes such as evaporation, sputtering, chemical vapor deposition (CVD), plating or electroplating. In one example the metal layer may comprise titanium and may have a thickness in the range of about 400 Å to about 800 Å. After the metal layer (not shown) is deposited, it may be annealed to form conductive silicide layer 187 which, in some embodiments, may be a titanium-silicon (TiSi) layer. In one example, the annealing may be performed in a temperature range of about 600° C. to about 850° C. After the formation of conductive layer 187, portions of layer 187 that are in undesirable locations on structure 100 may be removed using, for example, a wet etch process. Conductive layer 187 may be used to electrically coupled gate interconnect layer 185 and gate 155. Conductive layer 187 may be referred to as a "bridge" or coupling structure.

Figure 33:
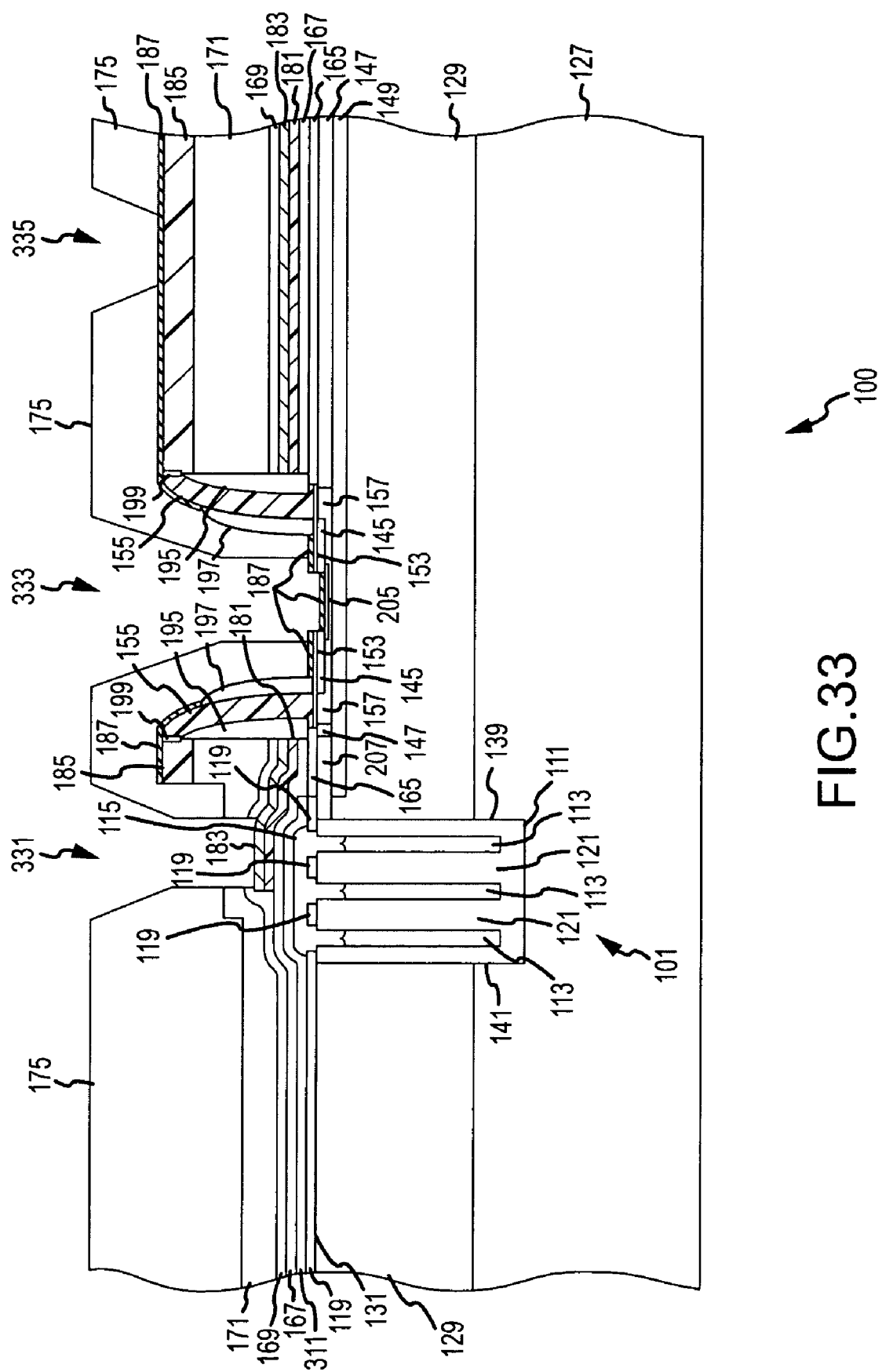
FIG. 33 is a cross-sectional view of the semiconductor structure of FIG. 32 at a later stage of manufacture.

Referring now to FIG. 33, a dielectric material 175 can be formed over the structure 100 and patterned to form openings 331, 333, and 335. In some embodiments, dielectric material 175 can be a doped glass such as, for example, phosphorus silicate glass (PSG), boron phosphorus silicate glass (BPSG), or dielectric material 175 can be an oxide formed using tetraethylorthosilicate (TEOS), and may be formed using either CVD or PECVD.

In some embodiments, openings 331, 333, and 335 can be formed using one or more etch processes. For example, two etch processes can be used to form openings 331, 333, and 335. The initial etch can be an isotropic etch and then a subsequent anisotropic etch can be performed to form openings 331, 333, and 335. Opening 331 exposes a portion of shield layer 183 and opening 335 exposes a portion of silicide layer 187 that contacts gate interconnect 185. Opening 333 exposes a portion of silicide layer 187 that is on doped regions 205 and 145.

Figure 34:
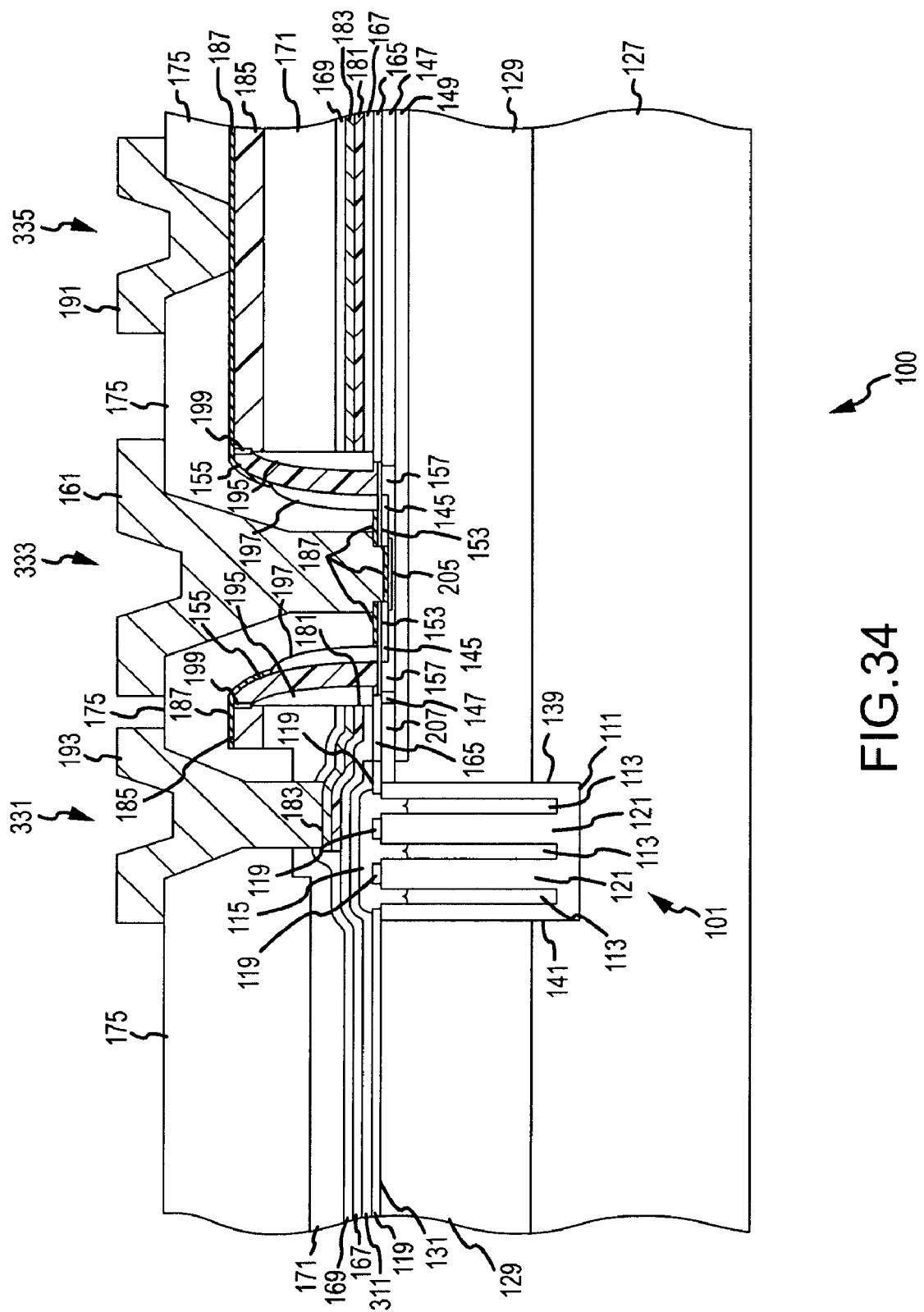
FIG. 34 is a cross-sectional view of the semiconductor structure of FIG. 33 at a later stage of manufacture.

Referring to FIG. 34, electrical contacts 193, 161, 191 can be formed in openings 331 (FIG. 33), 333 (FIG. 33), and 335 (FIG. 33), respectively. In some embodiments, openings 331, 333, and 335 can be lined with a barrier metal such as, for example, titanium nitride (TiN). Then a metal such as, for example, tungsten can be formed over the titanium nitride layer that lines openings 331 (FIG. 33), 333 (FIG. 33), and 335 (FIG. 33). The combination of the titanium nitride and tungsten forms titanium nitride/tungsten (TiN/W) plugs or contacts 193, 161, and 191 in openings 331 (FIG. 33), 333 (FIG. 33), and 335 (FIG. 33), respectively. Other metals or alloys such as, for example, aluminum (Al), aluminum-copper-tungsten (AlCuW), or aluminum-silicon-copper (AlSiCu) may also be used to form contacts 193, 161, and 191.

Turning back to FIG. 1, after the formation of electrical contacts 193, 161, and 191, a dielectric layer 179 such as, for example, PSG or silicon nitride, may be formed over structure 100. Dielectric layer 179 may have a thickness of at least about one micron and may be formed using PECVD. Dielectric layer 179 may be patterned to form openings 211, 213, and 215 to expose contacts 193, 161, and 191, respectively.

Electrical contact 161 coupled to source region 145 is a relatively low resistance thermal path for removing heat from semiconductor structure 100 during operation of FET 102. Electrical contact 161 is in close proximity to where the heat is generated in the transistor 102 and thus can remove the heat efficiently away from the bulk silicon.

Although isolation structure 101 is described herein as being formed prior to the formation of SiGeC layer 149, the methods and apparatuses described herein are not limited in this regard. In other embodiments, the SiGeC epitaxial layer may be formed prior to formation of the isolation structure. In these embodiments, the cavities of the isolation structure may be formed in, and through, the SiGeC layer.

Accordingly, various structures and methods have been disclosed to provide a high voltage (HV) and/or high frequency semiconductor transistor and methods for manufacturing this semiconductor transistor have been disclosed. In some embodiments, FET 102 may have a drain-to-source breakdown voltage (BVdss) of at least about ten volts or greater and can have a breakdown voltage of up to 100 volts or greater. In addition, in some embodiments, FET 102 may have an operating frequency of several hundred megahertz and can have an operating frequency of up to three gigahertz or greater.

Although specific embodiments have been disclosed herein, it is not intended that claimed subject matter be limited to the disclosed embodiments. Those skilled in the art will recognize that modifications and variations can be made without departing from the spirit of the disclosed subject matter. It is intended that the claimed subject encompass all such modifications and variations as fall within the scope of the appended claims.

What is claimed is:

1. A semiconductor structure, comprising:
    a semiconductor substrate;
    a first semiconductor material over the semiconductor substrate, wherein the first semiconductor material is a silicon epitaxial layer;
    a second semiconductor material over a portion the first semiconductor material, wherein the second semiconductor material comprises silicon-germanium-carbon (SiGeC);
    an active device, wherein a portion of the active device is formed in the second semiconductor material; and
    a dielectric structure extending from a first surface of the first semiconductor material into the semiconductor substrate through the first semiconductor material.

2. The semiconductor structure of claim 1, wherein the first semiconductor material is devoid, or substantially devoid, of germanium and the first semiconductor material is devoid, or substantially devoid, of carbon.

3. The semiconductor structure of claim 1, further comprising a third semiconductor material over the second semiconductor material, wherein the third semiconductor material is a silicon epitaxial layer.

4. The semiconductor structure of claim 1, wherein the dielectric structure comprises silicon dioxide, wherein the dielectric structure is a continuous structure that surrounds the portion of the active device, and wherein the dielectric structure comprises at least one void and a doped dielectric material over the void.

5. The semiconductor structure of claim 4, wherein the doped dielectric material is phosphorus silicate glass (PSG), boron silicate glass (BSG), or boron phosphorus silicate glass (BPSG) and wherein the doped dielectric material seals the void.

6. The semiconductor structure of claim 1, wherein the first surface of the first semiconductor is a top surface of the first semiconductor material, wherein a portion of the dielectric structure extends to a level below a bottom surface of the first semiconductor material, wherein the bottom surface of the first semiconductor material is parallel to, or substantially parallel to, the top surface of the first semiconductor material, and wherein the bottom surface of the dielectric structure is parallel to, or substantially parallel to, the first surface of the first semiconductor material.

7. The semiconductor structure of claim 1, wherein the bottom surface of the dielectric structure is parallel to, or substantially parallel to, the first surface of the first semiconductor material and wherein a sidewall of the dielectric structure is perpendicular, or substantially perpendicular to, the first surface of the first semiconductor material.

8. The semiconductor structure of claim 1, wherein the active device is a field effect transistor (FET) having a source region in at least a portion of the second semiconductor material, a channel region in at least a portion of the second semiconductor material, a gate over the channel region, and a drain region, wherein a portion of the drain region is in a portion of the second semiconductor material and the channel region is between the source region and the drain region.

9. The semiconductor structure of claim 8, further comprising a first conductive layer over the first surface of the first semiconductor material, wherein the first conductive layer is electrically isolated from the gate of the FET, wherein the first conductive layer is electrically coupled to the source region of the FET, wherein at least a portion the first conductive layer is over the dielectric structure, and wherein at least a portion of the first conductive layer is between at least a portion of the gate and at least a portion of the drain region.

10. A semiconductor structure, comprising:
    a semiconductor substrate;
    a first epitaxial layer over the semiconductor substrate;
    a second epitaxial layer over a portion of the first epitaxial layer, wherein the second epitaxial layer comprises silicon-germanium-carbon (SiGeC);
    a third epitaxial layer over the second epitaxial layer;
    a transistor, wherein a portion of the transistor is formed in the second epitaxial layer; and
    an isolation structure that extends from a first surface of the first epitaxial layer into the semiconductor substrate through the first epitaxial layer.

11. The semiconductor structure of claim 10, wherein the transistor is a unidirectional transistor and wherein the first epitaxial layer is a silicon epitaxial layer.

12. The semiconductor structure of claim 10, wherein the transistor is a field effect transistor (FET) having a source region in a portion of the second epitaxial region, a channel region in a portion of the second epitaxial region, a gate over the channel region, a drain region, wherein a portion of the drain region is in a portion of the second epitaxial region and the channel region is between the source region and the drain region.

13. The semiconductor structure of claim 12, wherein the FET is a vertical FET, wherein the gate is circular shaped, and wherein a channel length of the FET is approximately equal to a thickness of the gate.

14. The semiconductor structure of claim 12, wherein a doping concentration of an impurity material in the channel region from the source-channel junction to the drain-channel junction is substantially constant.

15. The semiconductor structure of claim 12, further comprising a first conductive layer over a first surface of the first epitaxial layer, wherein the first conductive layer is electrically isolated from the gate of the FET, wherein the first conductive layer is electrically coupled to the source region of the FET, wherein at least a portion of the first conductive layer is between at least a portion of the gate and at least a portion of the drain region.

16. The semiconductor structure of claim 12, further comprising:
    a second conductive layer coupled to the gate of the FET and over the first conductive layer; and a third conductive layer coupled to the gate of the FET and to the second conductive layer, wherein a first portion of the third conductive layer is over the second conductive layer and a second portion of the third conductive layer is over the gate.

17. A semiconductor structure, comprising a semiconductor material comprising silicon-germanium-carbon (SiGeC); a field effect transistor (FET) having a source region in at least a portion of the semiconductor material, a channel region in at least a portion of the semiconductor material, a gate over the channel region, and a drain region, wherein a portion of the drain region is in a portion of the semiconductor material and the channel region is between the source region and the drain region;

a first conductive layer coupled to the gate and over the semiconductor material; and a second conductive layer coupled to the gate and to the first conductive layer, wherein at least a portion of the second conductive layer is over the first conductive layer and is over the gate of the FET and wherein the second conductive layer contacts the gate and contacts the first conductive material.

18. The semiconductor structure of claim 17, wherein the first conductive layer comprises doped polysilicon, wherein the second conductive layer comprises silicide, and wherein a thickness of the second conductive layer is less than a thickness of the first conductive layer.

* * * * *